United States Patent [19]

Murdoch

[11] Patent Number: 5,701,121

[45] Date of Patent: Dec. 23, 1997

[54] TRANSDUCER AND INTERROGATOR DEVICE

[75] Inventor: Graham Alexander M. Murdoch, Perth, Australia

[73] Assignees: Uniscan Ltd.; Magellan Technology Pty. Ltd.

[21] Appl. No.: 356,782

[22] Filed: Dec. 12, 1994

Related U.S. Application Data

[63] Continuation of Ser. No. 849,641, Mar. 6, 1992, abandoned, which is a continuation of Ser. No. 459,763, filed as PCT/AU89/00157, Apr. 11, 1989, abandoned.

[30] Foreign Application Priority Data

Apr. 11, 1988 [AU] Australia .................. PI7683

[51] Int. Cl.$^6$ ............................................... G08C 19/00
[52] U.S. Cl. .................. 340/825.54; 340/825.72; 340/870.31; 455/41
[58] Field of Search ................ 340/825.54, 825.72, 340/572, 870.3, 870.31, 870.32, 825.3, 825.31, 825.69; 455/41, 60; 342/44, 51; 324/207.15, 207.16, 207.22

[56] References Cited

U.S. PATENT DOCUMENTS

| | | | |
|---|---|---|---|
| 2,597,264 | 5/1952 | Russell et al. | 340/825.72 |
| 3,036,295 | 5/1962 | Kleist . | |
| 3,047,783 | 7/1962 | Oort et al. | 340/825.72 |
| 3,169,242 | 2/1965 | Davis et al. . | |
| 3,172,102 | 3/1965 | Chapman . | |
| 3,351,938 | 11/1967 | Gray . | |
| 3,361,977 | 1/1968 | Winkle et al. | 340/825.69 |
| 3,438,489 | 4/1969 | Cambornac et al. . | |
| 3,713,102 | 1/1973 | Martin . | |
| 3,752,960 | 8/1973 | Walton . | |
| 3,766,476 | 10/1973 | Silitch | 455/55.1 |
| 3,816,709 | 6/1974 | Walton . | |
| 3,855,592 | 12/1974 | Davis et al. . | |
| 3,859,652 | 1/1975 | Hall et al. . | |
| 3,898,619 | 8/1975 | Carsten et al. . | |
| 3,964,024 | 6/1976 | Hutton et al. . | |
| 3,982,243 | 9/1976 | Gustavsson et al. . | |
| 4,040,053 | 8/1977 | Olsson . | |
| 4,068,232 | 1/1978 | Meyers et al. . | |
| 4,070,672 | 1/1978 | Becker et al. . | |
| 4,129,855 | 12/1978 | Rodrian . | |
| 4,196,418 | 4/1980 | Kip et al. . | |

(List continued on next page.)

FOREIGN PATENT DOCUMENTS

| | | |
|---|---|---|
| 2163324 | 2/1986 | United Kingdom . |
| 2191029 | 12/1987 | United Kingdom . |

*Primary Examiner*—Jeffery Hofsass
*Assistant Examiner*—Andrew Hill
*Attorney, Agent, or Firm*—Learman & McCulloch

[57] ABSTRACT

A transducer and interrogator device is disclosed in which the interrogator provides power and information to the transducer via a magnetic field. The transducer is a passive actuator device that includes an inductive pickup coil that, when subjected to the interrogator's magnetic field, powers the passive actuator and an external electrical device. The magnetic field produced by the interrogator can be modulated in such a manner as to provide identification, commands, or other information to the passive actuator without substantially reducing the power transferred to the passive actuator. Modulation can be by amplitude, phase, frequency, pulse width, or pulse position. An antiphase magnetic field can also be generated to cancel far field radiation. The passive actuator can include a logic circuit to demodulate any received data from the interrogator via the magnetic field, which data can be used to control the operation of the external device. The passive actuator can also include a circuit for transmitting information back to the interrogator using the power extracted from the interrogator's magnetic field. Transmission can be either by a modulated electromagnetic signal generated by an oscillator internal to the passive actuator or by coupled impedance signalling using the passive actuator's pickup coil.

39 Claims, 25 Drawing Sheets

U.S. PATENT DOCUMENTS

| | | |
|---|---|---|
| 4,263,595 | 4/1981 | Vogel . |
| 4,333,072 | 6/1982 | Beigel . |
| 4,361,153 | 11/1982 | Slocum et al. . |
| 4,364,043 | 12/1982 | Cole et al. . |
| 4,388,524 | 6/1983 | Walton . |
| 4,424,438 | 1/1984 | Antelman et al. . |
| 4,463,353 | 7/1984 | Kuzara ............................... 340/825.54 |
| 4,517,563 | 5/1985 | Diamant ............................. 340/825.54 |
| 4,546,241 | 10/1985 | Walton . |
| 4,551,712 | 11/1985 | Fockens . |
| 4,580,041 | 4/1986 | Walton . |
| 4,600,829 | 7/1986 | Walton . |
| 4,602,253 | 7/1986 | Kreft . |
| 4,654,658 | 3/1987 | Walton . |
| 4,656,472 | 4/1987 | Walton . |
| 4,691,202 | 9/1987 | Denne et al. ....................... 340/825.54 |
| 4,694,292 | 9/1987 | Masaki . |
| 4,724,427 | 2/1988 | Carroll ............................... 340/825.54 |
| 4,742,470 | 5/1988 | Juengel ............................. 340/870.32 |
| 4,779,839 | 10/1988 | Sears ................................. 340/825.54 |
| 4,845,347 | 7/1989 | McCrindle et al. ................ 235/380 |
| 4,879,756 | 11/1989 | Stevens et al. .................... 340/825.69 |
| 4,912,471 | 3/1990 | Tyburski et al. ................... 455/41 |
| 4,983,963 | 1/1991 | Hodgetts et al. .................. 340/870.31 |
| 5,019,813 | 5/1991 | Kip et al. ........................... 340/825.54 |
| 5,021,778 | 6/1991 | Walton ............................... 340/825.54 |
| 5,095,309 | 3/1992 | Troyk et al. ....................... 340/825.54 |
| 5,153,583 | 10/1992 | Murdoch ............................ 340/825.54 |
| 5,164,719 | 11/1992 | Guena et al. ...................... 340/825.54 |
| 5,167,229 | 12/1992 | Peckham et al. .................. 607/48 |
| 5,260,701 | 11/1993 | Guern et al. ...................... 340/825.54 |
| 5,351,042 | 9/1994 | Aston ................................. 340/825.31 |
| 5,440,300 | 8/1995 | Spillman, Jr. ...................... 340/825.54 |

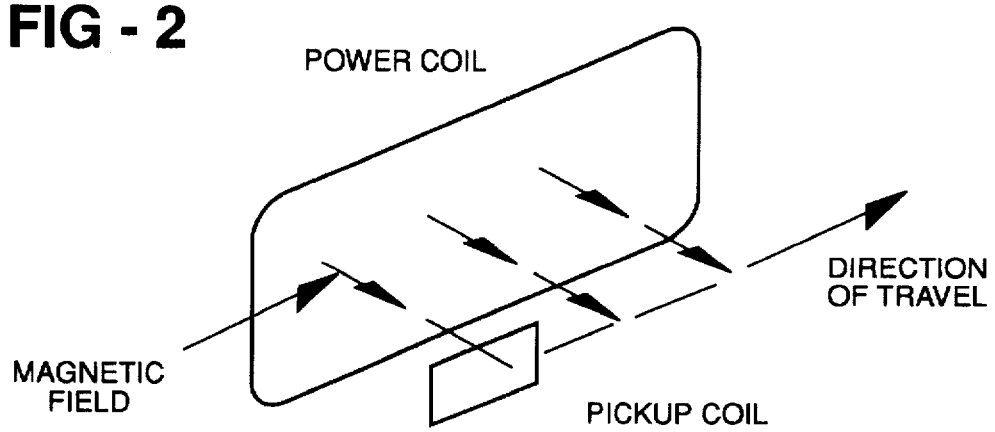
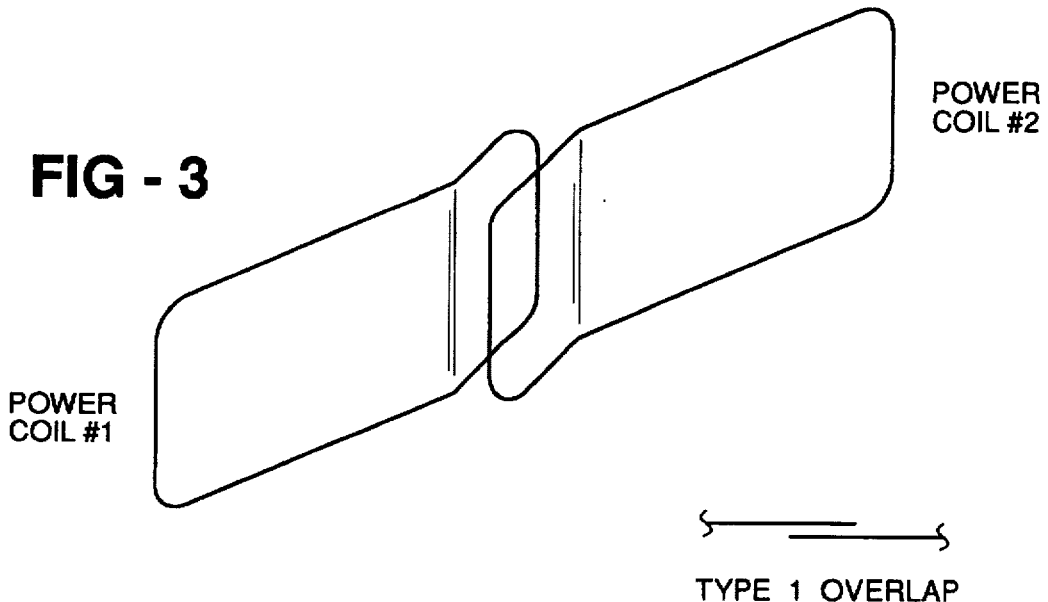

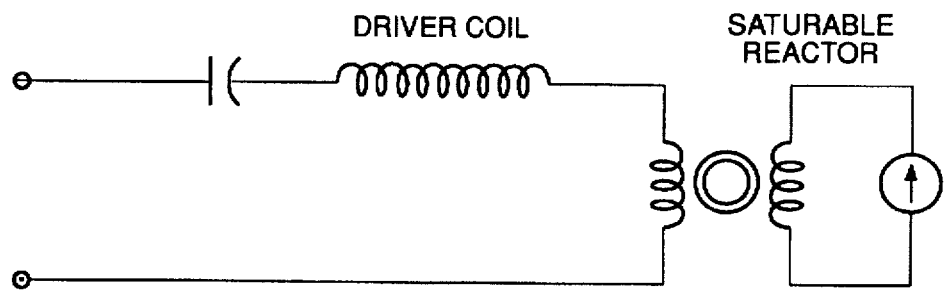
FIG - 10a
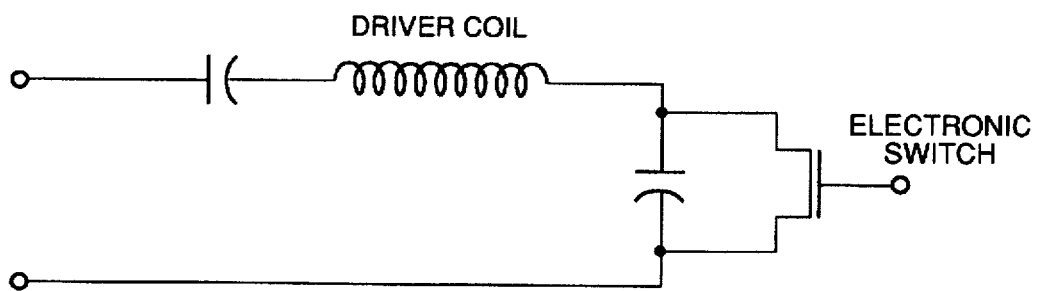
FIG - 10b
FIG - 11
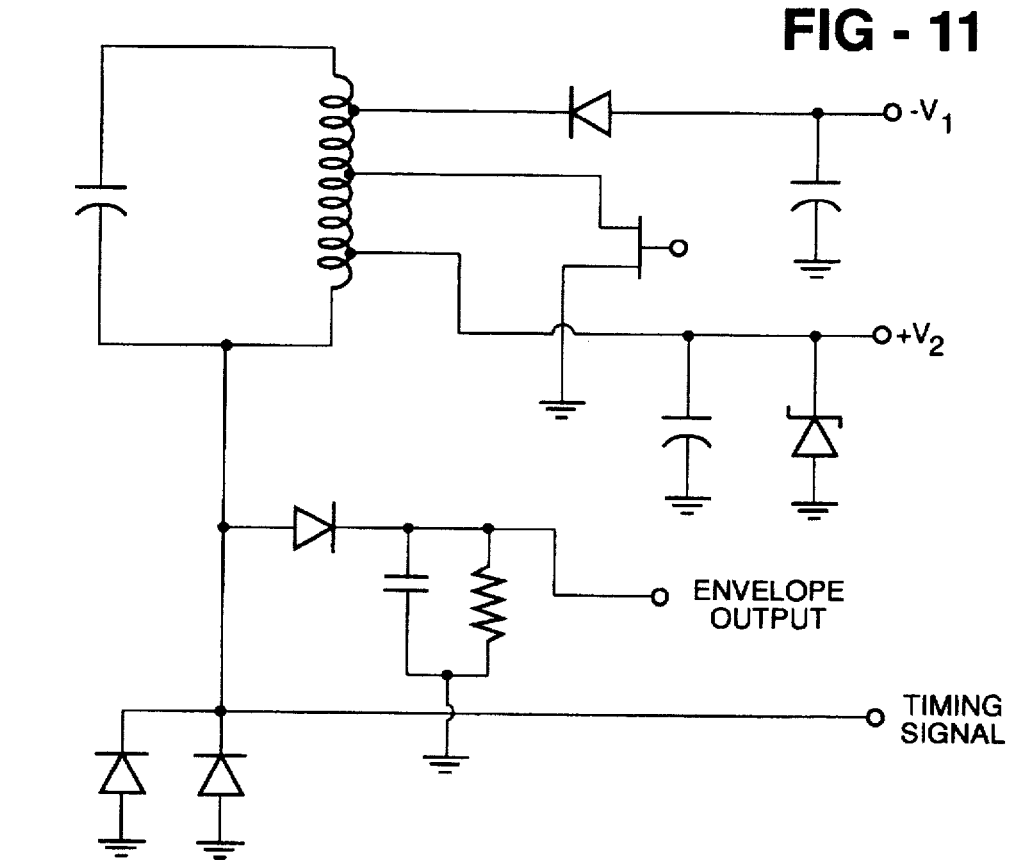

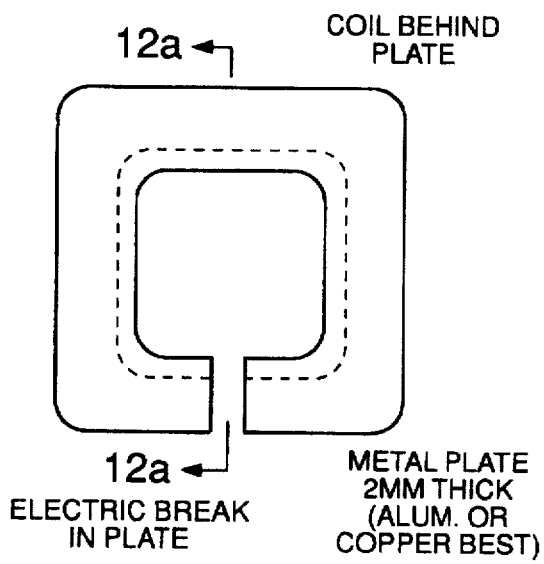
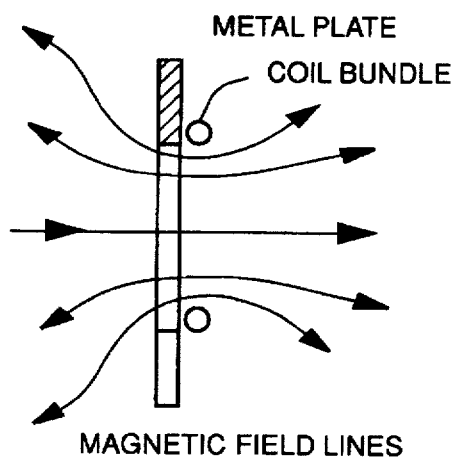
FIG - 12
FIG - 12a
FIG - 13
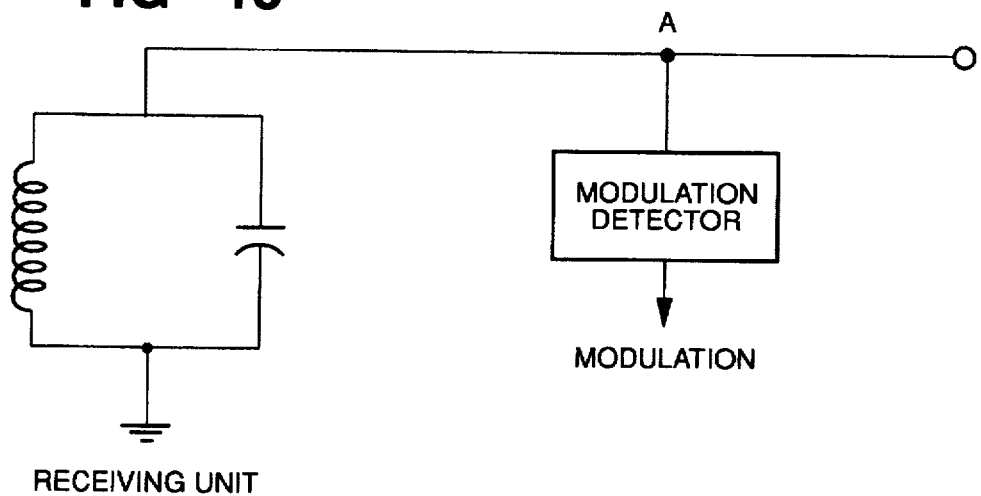
FIG - 14
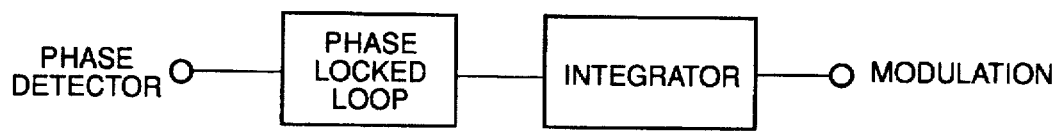

PHASER DIAGRAM OF
ANTENNA CIRCUIT IMPEDANCE

PHASER DIAGRAM OF $I_L$ FOR $C_1$ AND $C_2$ IN CIRCUIT

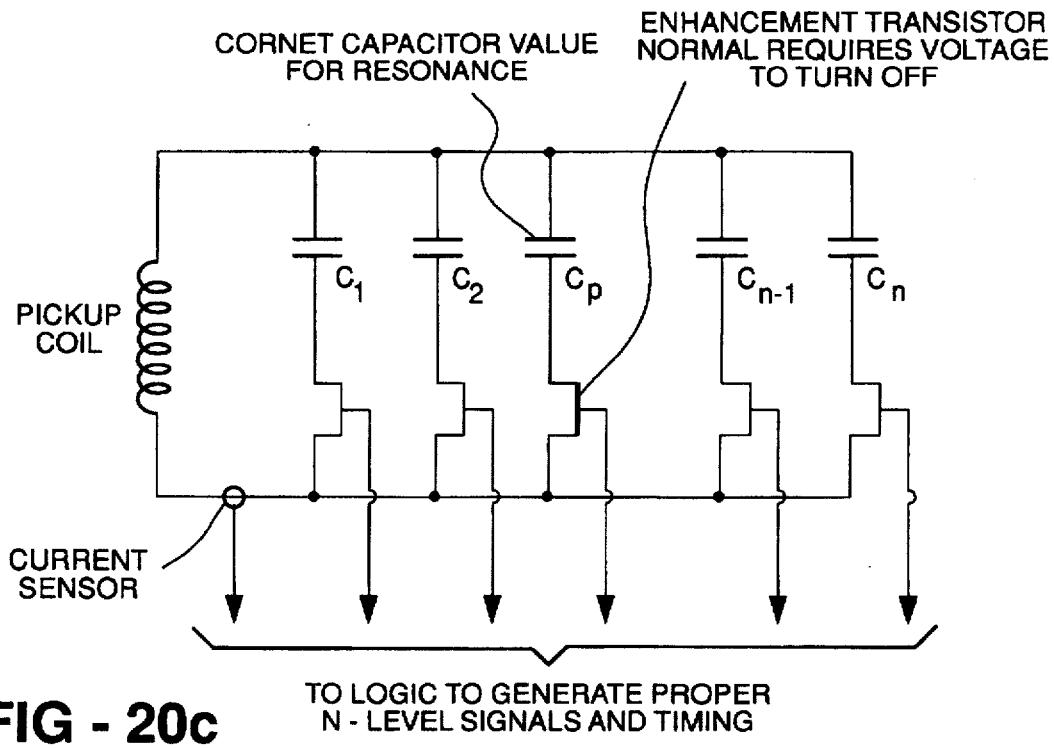
FIG - 20c
FIG - 20d-1
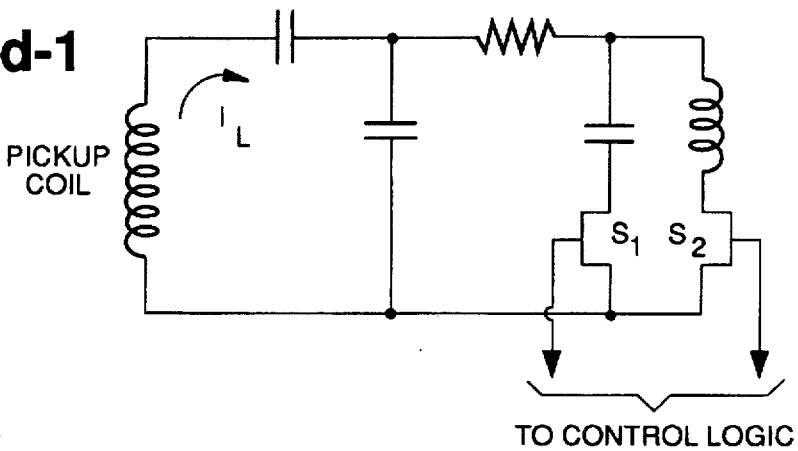
FIG - 20d-2
PHASER DIAGRAM OF $I_b(S_L$ STATE, $S_2$ STATE)
0 = OFF, 1 = ON

PHASER DIAGRAM FOR ANTENNA IMPEDANCE

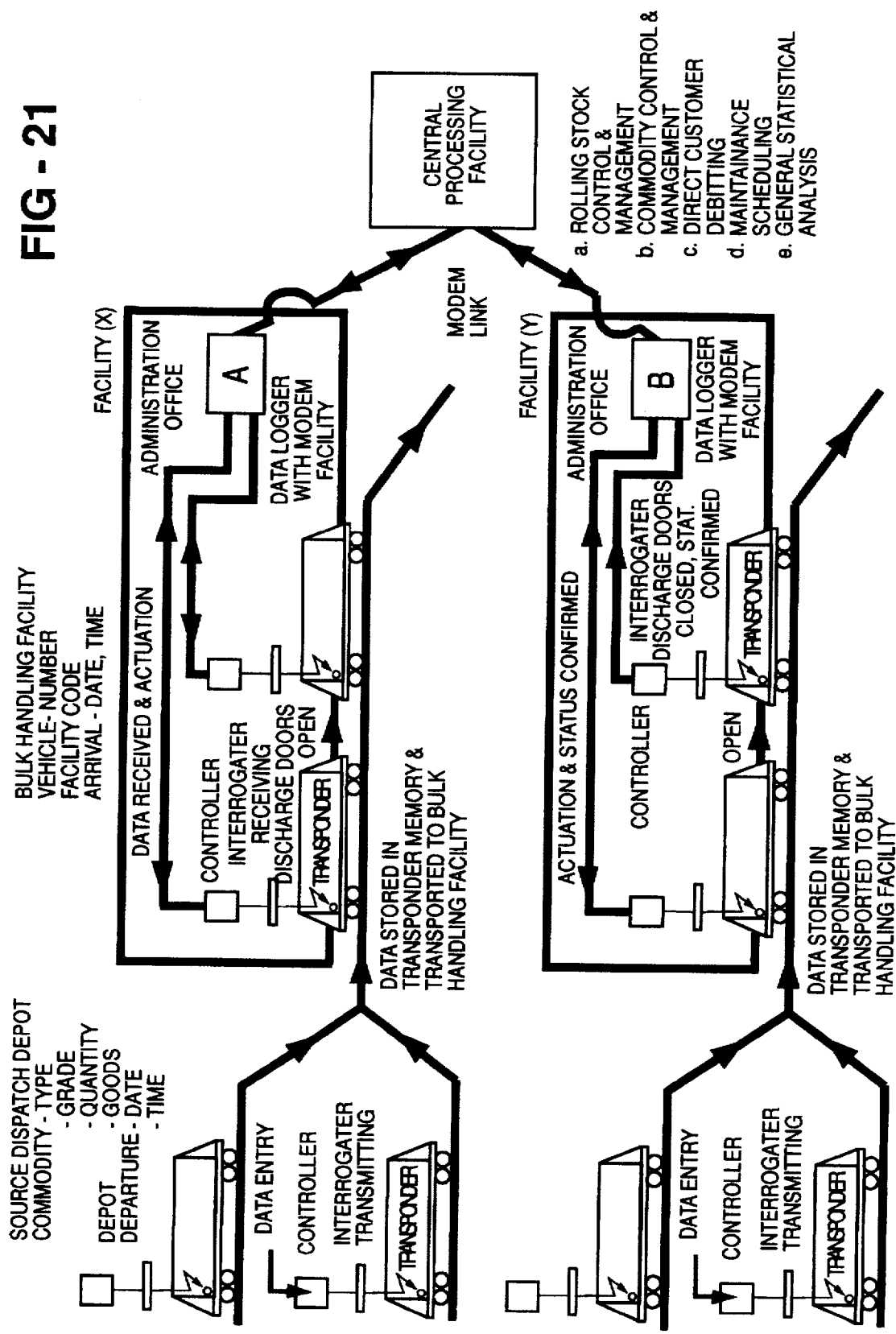

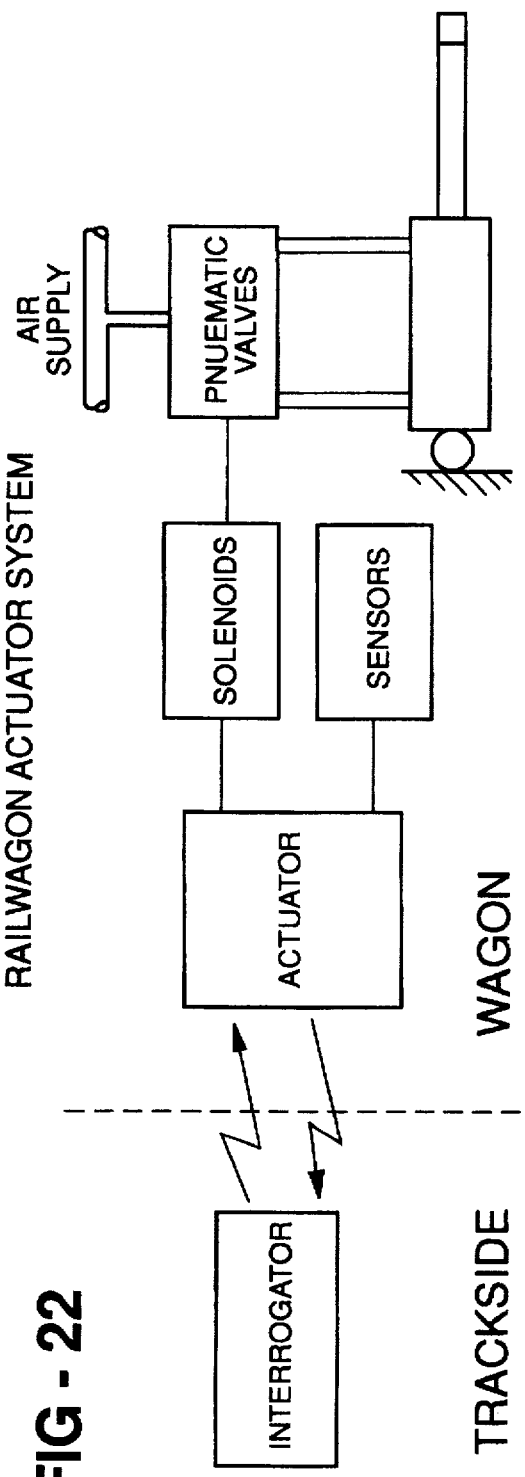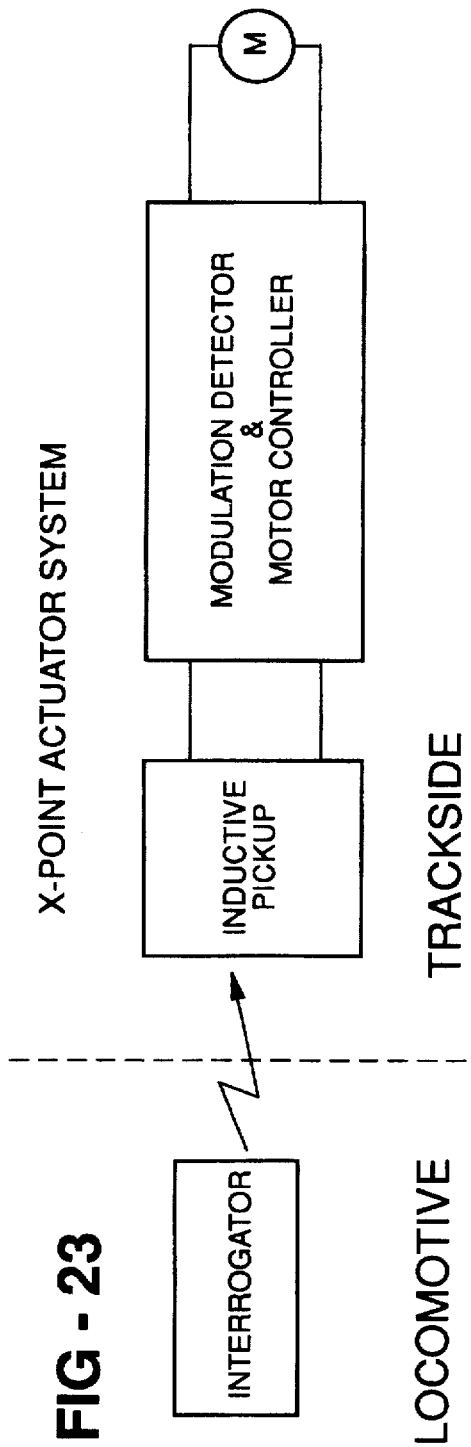

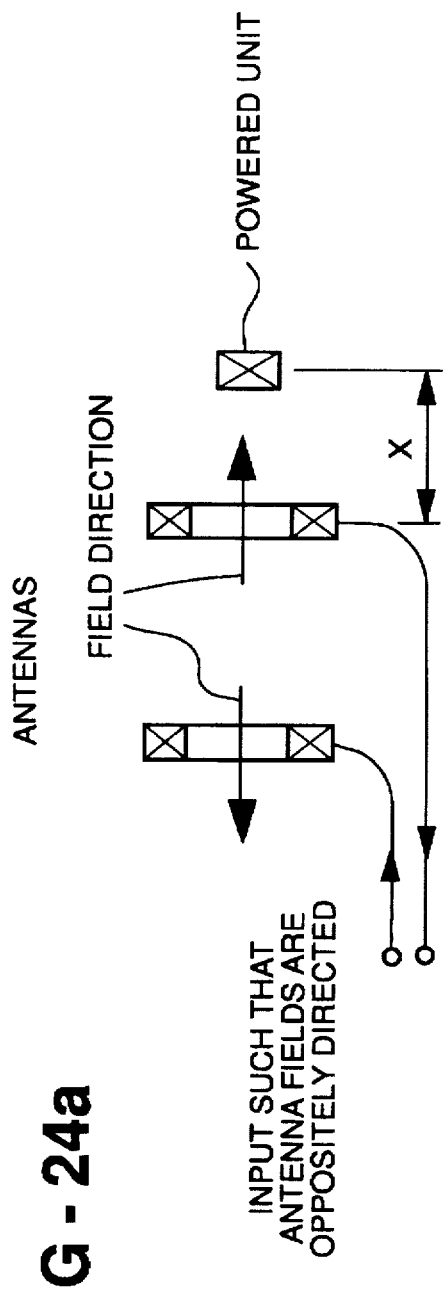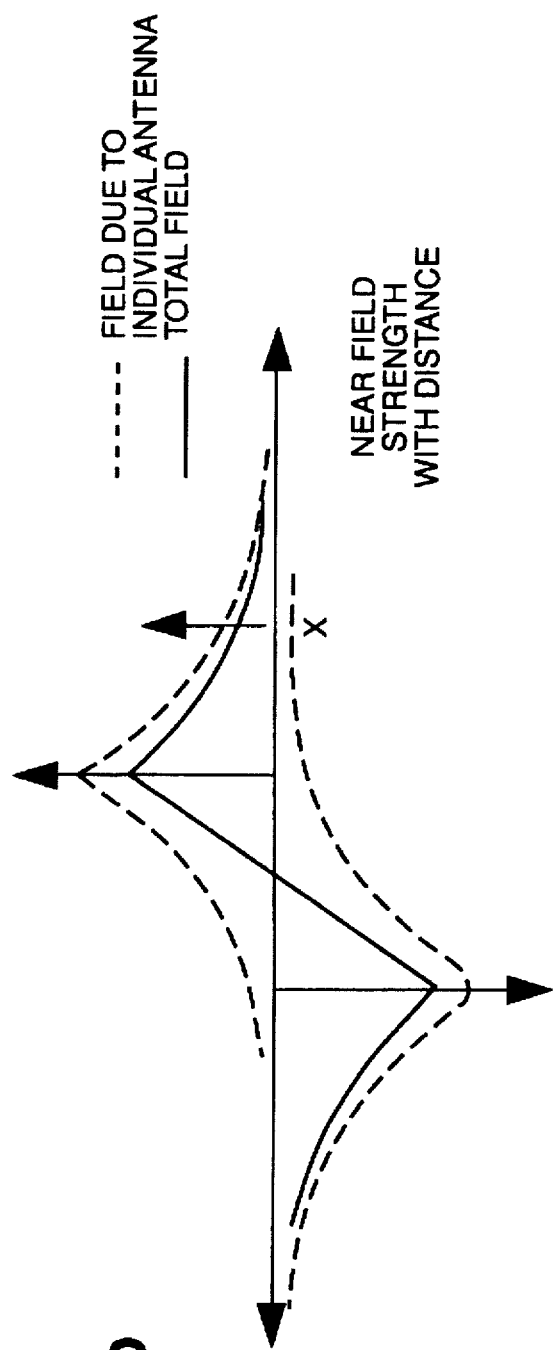
FIG - 24a
FIG - 24b

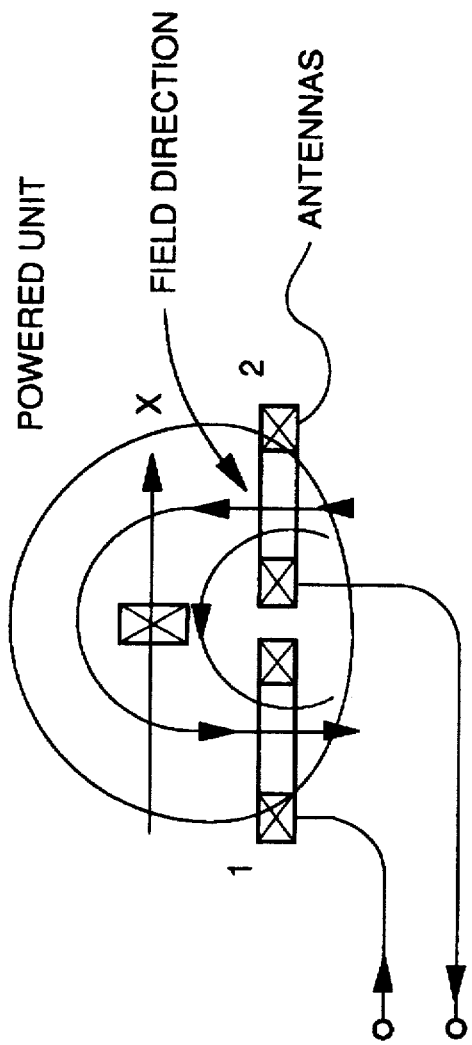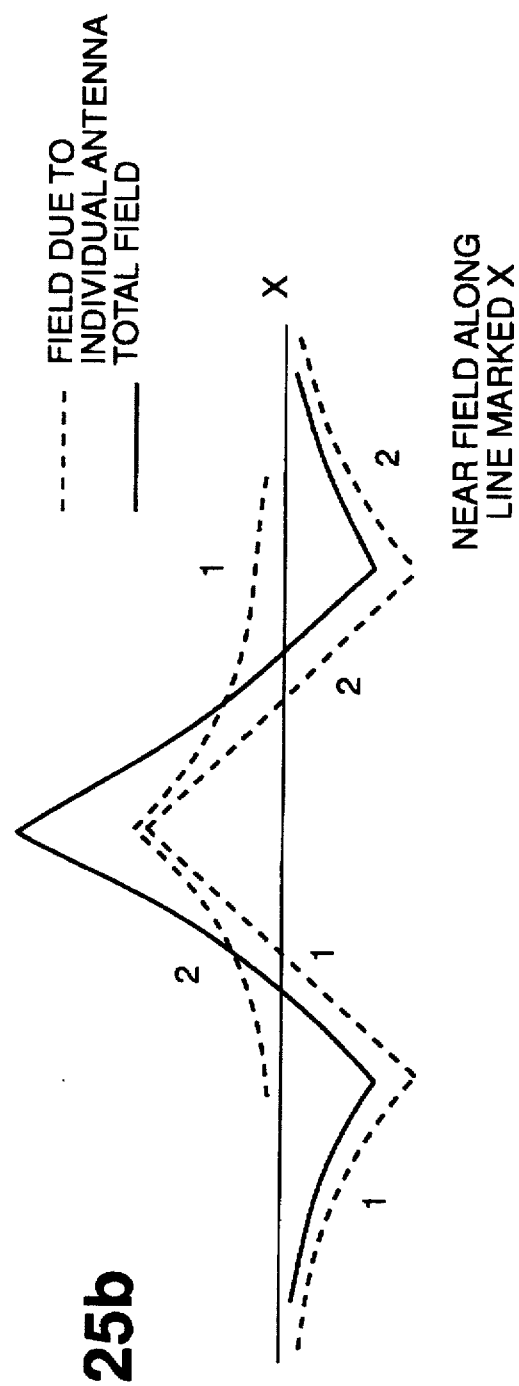
FIG - 25a
FIG - 25b

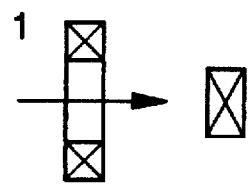
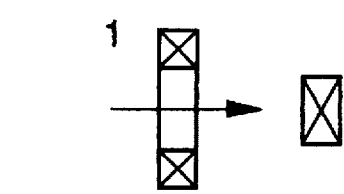
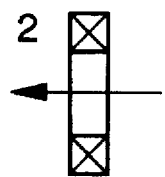
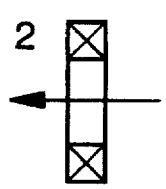
FIG - 26a
FIG - 26c
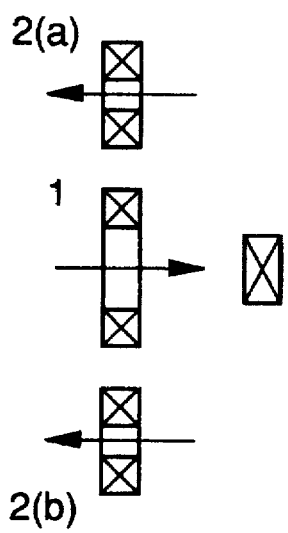
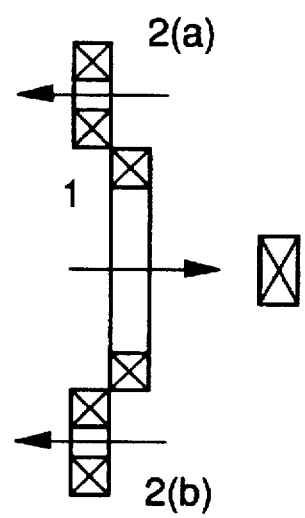
FIG - 26b
FIG - 26d

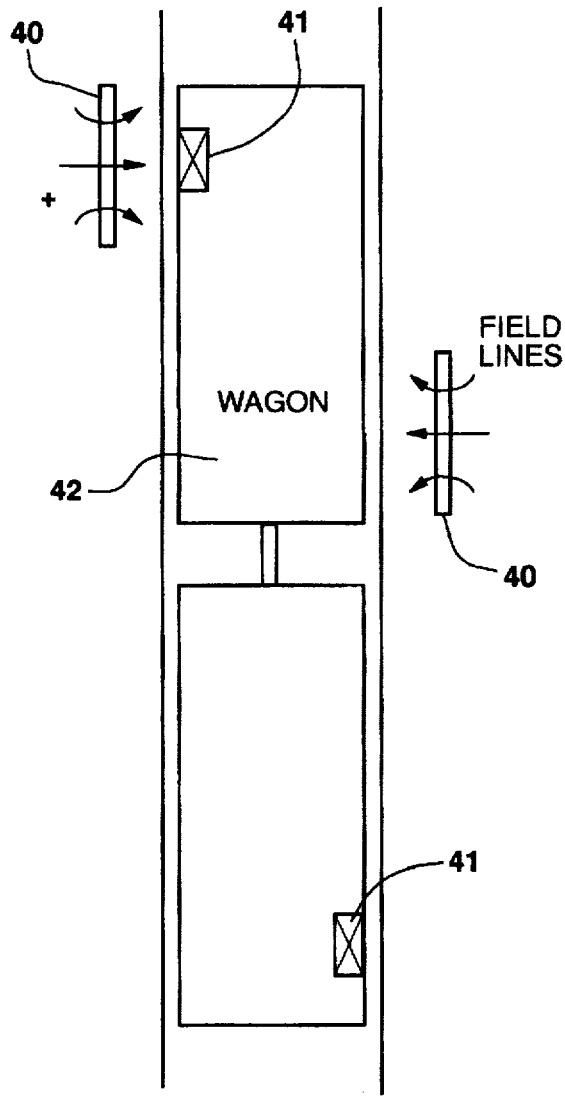
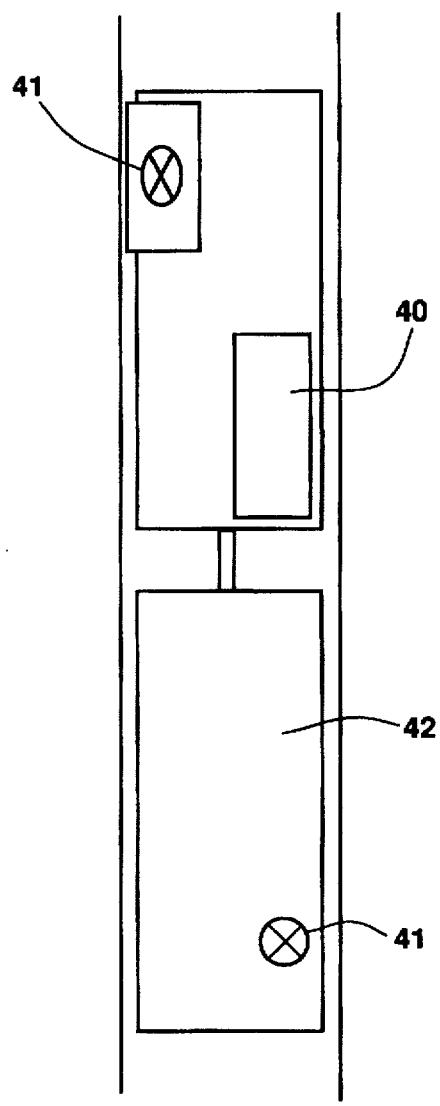
FIG - 27  FIG - 28
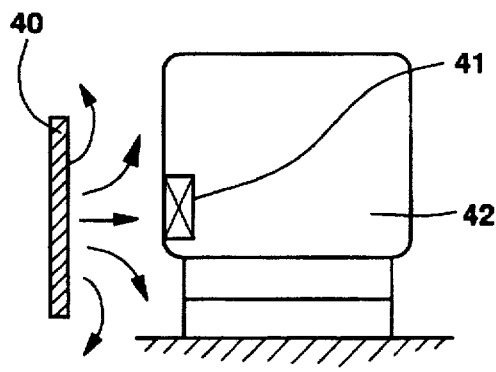
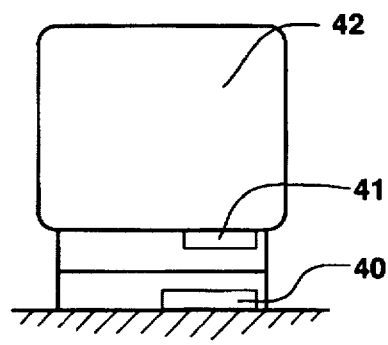
FIG - 29  FIG - 30

TRANSDUCER AND INTERROGATOR DEVICE

This is a continuation of application Ser. No. 07/849,641, filed on Mar. 6, 1992, now abandoned, which is a continuation of Ser. No. 07/459,763, filed Jan. 12, 1990, now abandoned, International Application PCT/AU89/00157 filed on Apr. 11, 1989 and which designated the U.S.

Copending U.S. patent application Ser. No. 07/499,294 filed May 18, 1990 entitled "TRANSPONDER", corresponding to Australian PI5479, filed Nov. 18, 1987, is hereby incorporated by reference.

FIELD OF INVENTION

The present invention relates to the field of remote control actuator systems. More particularly, the present invention relates to a remote control device adapted to perform electrical or electromechanical functions or tasks. The present invention also relates to an identification and communication system.

A copending Australian Patent Application PI 5479, filed 18th Nov., 1987, by Applicants entitled "TRANSPONDER" is hereby incorporated by reference. Reference herein to "transponder" may include the aforementioned transponder. The actuator of the present invention serves to operate or function, in principle, similarly to the transponder therein disclosed.

PRIOR ART

Actuator systems known herebefore comprise an interrogator and responder which communicate by transmitting and receiving electromagnetic signals. These systems can be broadly divided into two classes, active and passive systems. Passive systems are without a power source in the responder. Typically power is supplied by the interrogator. Active systems contain a battery or similar power source in the responder.

The inventor is aware of several broad classes of passive transponder systems. One such class utilises the microwave spectrum. In one such system the transponder extracts energy from the interrogation signal and retransmits its data signal using a harmonic of the interrogation signal, U.S. Pat. No. 4,068,232 and U.S. Pat. No. 4,040,053. Another system uses a series of delay lines and transducers tapped off the transponders antenna. The output from these elements is recombined and reradiated carrying coded information, see U.S. Pat. No. 4,263,595. Still another system reflects a portion of the microwave interrogation signal using a switched dipole antenna while being powered from a low frequency inductive field, U.S. Pat. No. 4,038,653. Another group of systems utilises a swept frequency interrogation signal to periodically resonate with suitable structures in the transponder U.S. Pat. Nos. 4,070,672, 3,982,243 or interact with delay elements producing coded transmissions AU-B-34003/84, AU-B-34003/84.

These systems suffer from statutory limits on their radiation levels, difficulties in confining the microwave energy, harmonic interference from the "diode" effect in metallic joints and false reflections or "clutter" from extraneous objects.

Another known system utilised a tapped microwave surface acoustic wave delay line. The interrogation signal is fed to the delay line through the transponders antenna, after passing through it is retransmitted carrying coded modulation. Long codes are difficult to produce and the reply signals are weak necessitating the use of complex receiving circuitry. Further, the most suitable frequencies for operation are not available for unrestricted use, see U.S. Pat. Nos. 4,059,831, 3,706,094, AU 11635/70.

Another class of systems uses inductive power of the transponder. Data is radiated from the transponder using a second uncoupled antenna. For inductive signalling the strength of coupling is proportional to the antenna's overall size. Where the transponder's size is limited the use of two separate antennas, for power reception and data communication, would require smaller less efficient antennas. Duplexing a single antenna precludes simultaneous operation, reduces the data rate and introduces further losses to the system. The following patents are in the class of inductive dual antenna systems, Carsten U.S. Pat. No. 3,898,619, Fockons U.S. Pat. No. 4,551,712, Hutton U.S. Pat. No. 3,964,024, Hall U.S. Pat. No. 3,859,652, Cambornal U.S. Pat. No. 3,438,489, Minasy AU 2222/66, Davis U.S. Pat. No. 3,855,592, Rodman U.S. Pat. No. 4,129,855, Kriofsky U.S. Pat. No. 3,859,624, Kaplan U.S. Pat. No. 3,689,885, Buttener AU-A-46197/85 and Walton U.S. Pat. No. 4,600,829.

In another class of patents described by Gray U.S. Pat. No. 3,351,938, Davis U.S. Pat. No. 3,169,242, Kleist U.S. Pat. No. 3,036,295, Sweeney U.S. Pat. No. 3,182,315, Chapman U.S. Pat. No. 3,172,102, Jones U.S. Pat. No. 3,054,100, Currie U.S. Pat. No. 3,145,380 and Kleist U.S. Pat. No. 3,036,295 carefully defined sidebands are transmitted by the transponder in response to an interrogation signal. The sideband frequencies are either sourced by the interrogation signal or generated locally by the transponder. Such systems require a multiple of filters to select and/or generate sufficient sideband frequencies to transmit a meaningful amount of data. Long code sequences are not practical, nor are they readily programmable. Furthermore, many of these systems require two antenna in the transponder for example Jones, Chapman, Kleist and Sweeney all require two antennas and Currie require a multitude of separate antennas.

Another class of patents described by Walton U.S. Pat. Nos. 3,752,960, 3,816,709 and 4,388,524 utilises a frequency swept source which resonates a set of tuned circuits in the transponder. The system is disadvantaged if long code sequences are required and is not readily programmable, moreover the same difficulties apply where transponder size is limited as discussed above. Furthermore, the system is incapable of deriving any significant power for reduction to solenoids and the like from the swept source.

The inventor is aware of a sub-harmonic signalling method wherein the current flow in a tuned circuit is periodically interrupted generating a coded sub-harmonic field, Cole U.S. Pat. No. 4,364,043. This system is disadvantaged by deactivating the transponder coil for significant portions of time which reduces the amount of power received by the unit. This reduction is 50% for the first sub-harmonic.

In another group of systems described by Vinding U.S. Pat. No. 3,299,424, Kip U.S. Pat. No. 4,196,418, Beigel U.S. Pat. No. 4,333,072, Walton U.S. Pat. No. 4,546,241, Kreft U.S. Pat. No. 4,602,253, Walton U.S. Pat. No. 4,580,041 and Foletta U.S. Pat. No. 4,650,981 inductive coupling is used to power a tuned circuit resonant at the powering frequency. The reply signal is generated by periodically loading or even shortening the tuned circuit. This practice severely restricts the power collecting capability of the tuned circuit. Moreover, the application of the load or short is unrelated to the current and voltage waveforms in the tuned circuit. Consequently, the maximum switching rate must be less than the tuned circuit's bandwidth otherwise the circuit transients will not have settled and the reply signal will be attenuated. For high Q circuits this severely limits the data rate, yet it can be shown that high Q circuits provide the strongest reply signal. Consequently, long codes are not practicable if rapidly moving transponders are being interrogated and long range or efficient power transfer are required. A related group of systems detune the transponders tuned circuit.

Once again, the detuning changes are not related to the current and voltage waveforms. The data rate must be less than the tuned circuits bandwidth. Slocum and Batly U.S. Pat. No. 4,361,153, Walton U.S. Pat. No. 4,654,658, Walton U.S. Pat. No. 4,656,472 and Kep U.S. Pat. No. 4,196,418 utilise this principle of detuning modulation. Once again high Q tuned circuits preclude high modulation rates and consequently are unsuitable for long code or rapidly moving transponders.

None of these inductive transponders are reprogrammable while "on the fly" that is while being interrogated nor do they utilise multi-level signalling to extend their effective data rate where high Q tuned circuits for efficient power collection are necessary.

SUMMARY OF INVENTION

An object of the present invention is to provide a device for remote control to perform electrical or electromechanical functions.

Another object of the present invention is to provide a powering and/or communication system for remote device (s).

Another object of the present invention is to provide an actuator which receives power and transmits signals simultaneously from a single coil.

Another object of the present invention is to provide an actuator adapted to be substantially wholly integrated on one chip.

The present invention provides in one form an actuator comprising:
  a transponder adapted to provide control signals for the control of electrical and/or electromechanical devices.

The present invention provides in one form a device adapted to be influenced by a magnetic powering field, said device having an inductive means therein, said inductive means being arranged to receive said magnetic field and provide a signal to be rectified for supplying power to said device, said inductive means also being arranged to simultaneously transmit signals to an interrogator.

The inductive means may include a single coil and/or the transmitted signals may include data, status and/or information signals.

This application describes a passive transponder system wherein the interrogation signal is a low frequency inductive field utilized for both powering of, and communication with, the responder and wherein a single inductive antenna is used simultaneously for power reception and data communication between the interrogator and the responder. Furthermore, an explicit function of the responder is to supply power to external devices, such as solenoid valves or read external sensor data under the direction of the interrogator.

The present invention in another form provides a device including a coil,
  said coil being arranged to receive an impinging magnetic field and provide a first signal for rectification, the rectified signal being adapted to power said device, and wherein:
  a first portion of said coil is arranged to receive a second signal for transmission, the portion of the coil being adapted to simultaneously transmit said second signal and receive said magnetic field for rectification.

The present invention in another form provides a system for remote control of at least one device, said system comprising:
  an actuator adapted to perform a controlling function upon each device, said actuator adapted to receive power for performing the controlling function from a magnetic field, said actuator comprising a single coil for receiving said power, and
  interrogator means adapted to radiate said magnetic field and influence said actuator when the two are in proximity, wherein
    said actuator is adapted to simultaneously transmit signals from said coil.

The present invention in another form provides a communication system comprising:
  an interrogator adapted to radiate a magnetic field, and
  an actuator adapted to receive said magnetic field and transmit data to said interrogator, wherein:
    said magnetic field comprises magnetic field modulation, the actuator being adapted to demodulate said field and interpret data obtained thereby, and wherein:
    said actuator data transmission includes coupled impedance signalling, said signalling being adapted to occur simultaneously with said field modulation for interpretation by said interrogator.

The communication system may further include full duplex magnetic signalling.

The present invention in another form provides a controller for a railway switch point, said controller comprising:
  an actuator adapted to receive power from an impinging magnetic field, the actuator providing control signals to a solenoid means for controlling the position of said railway switch point,
  an interrogator adapted to radiate said magnetic field when in proximity to said actuator.

The magnetic field may be interpreted by said actuator so as to allow positioning of said switch point to one of a plurality of possible positions.

The present invention also provides in one form, a system for controlling rolling stock, comprising:
  a first interrogator located at a loading terminal,
  a second interrogator located at an unloading terminal, said second interrogator being spaced from said first interrogator,
  an actuator mounted on said rolling stock and adapted to be influenced by both interrogators at their respective locations,
  said first interrogator being adapted to communicate with said actuator, the actuator being adapted to store data so communicated for transmission to and interpretation by said second interrogator when required,
  said second interrogator being adapted to radiate a magnetic field to influence the actuator to control unloading of said stock, the actuator being adapted to transmit said data, if required, to said second interrogator while under the influence of said magnetic field.

The device, system and/or controller hereinbefore described may include a transponder.

Reference throughout this document to "coil" is to be construed broadly, i.e. any suitable means for signal, communication and power transmission and/or reception, for example an antenna structure.

DESCRIPTION OF THE DRAWINGS

A preferred embodiment of the present invention will now be described with reference to the accompanying drawings, wherein:

FIGS. 2 and 2A show one form of coil structure.

FIGS. 3 and 3A show one form of concatenating coil structure.

FIGS. 7, 8, 8A, 9 and 11 show example coil/rectifier forms.

FIGS. 10A and 10B show examples of tuning means.

FIGS. 12 and 12A show an example magnetic field concentrator.

FIGS. 13, 14, 14A, and 14B show example modulation detector/decoders.

FIGS. 20, 20A, 20C, 20D, 20E, 20F, 20G, and 20H show example circuits and diagrams used with impedance monitoring signalling.

FIG. 21 shows an exemplary applicator of the present invention to a bulk goods loading/handling facility.

FIG. 22 shows an actuator system suitable for railway wagons.

FIG. 23 shows an actuator system suitable for railway switch point control.

FIG. 24 shows an antenna arrangement having a strong near field and a substantially cancelled far field.

FIGS. 25 and 26 show exemplary antenna arrangements having substantially cancelled far field.

FIGS. 27 to 30 show schematically applications of the actuator of a remote control system.

DETAILED DESCRIPTION OF THE INVENTION

Figure 1A:
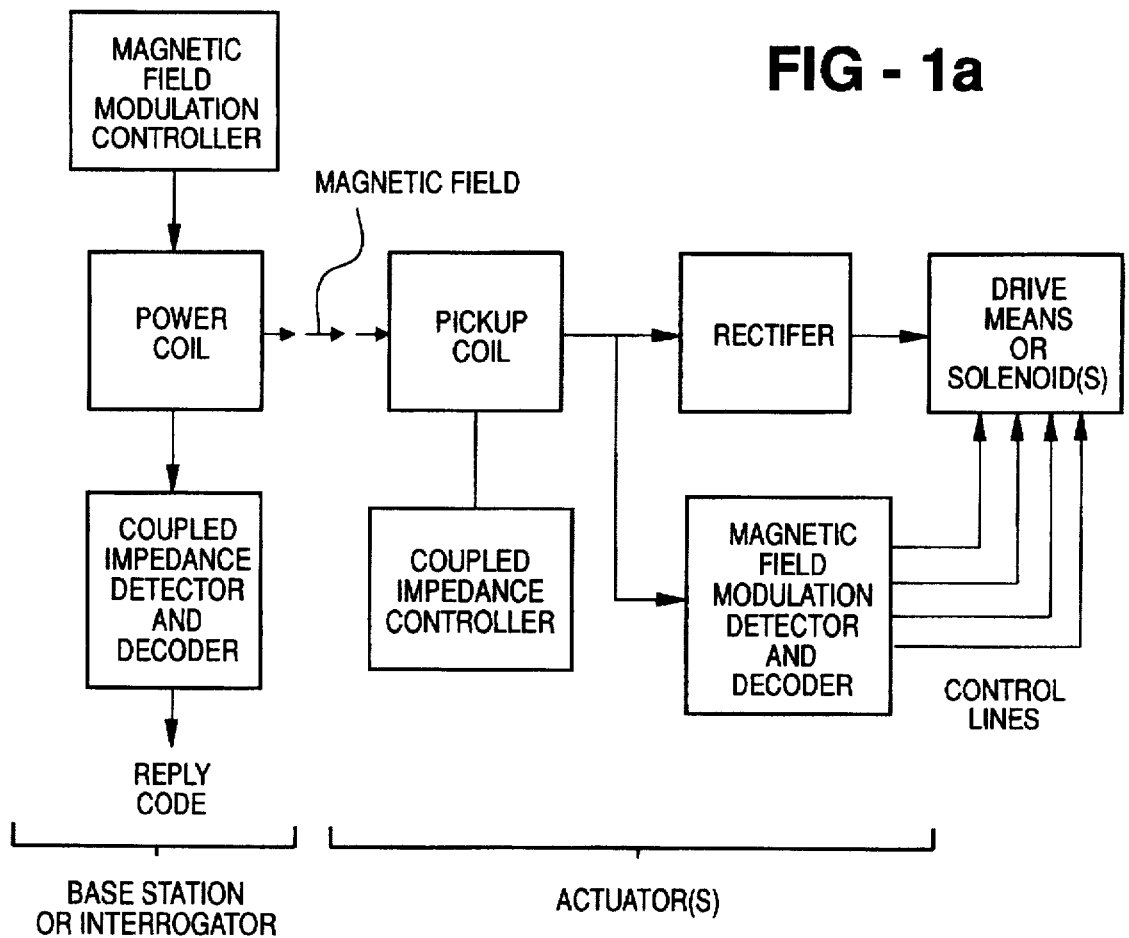
FIGS. 1A and 1B show basic block diagram forms of the system according to the present invention. Note, the coupled impedance detector and/or controller are optionally required for communication between the base station and actuator(s).
Figure 1B:
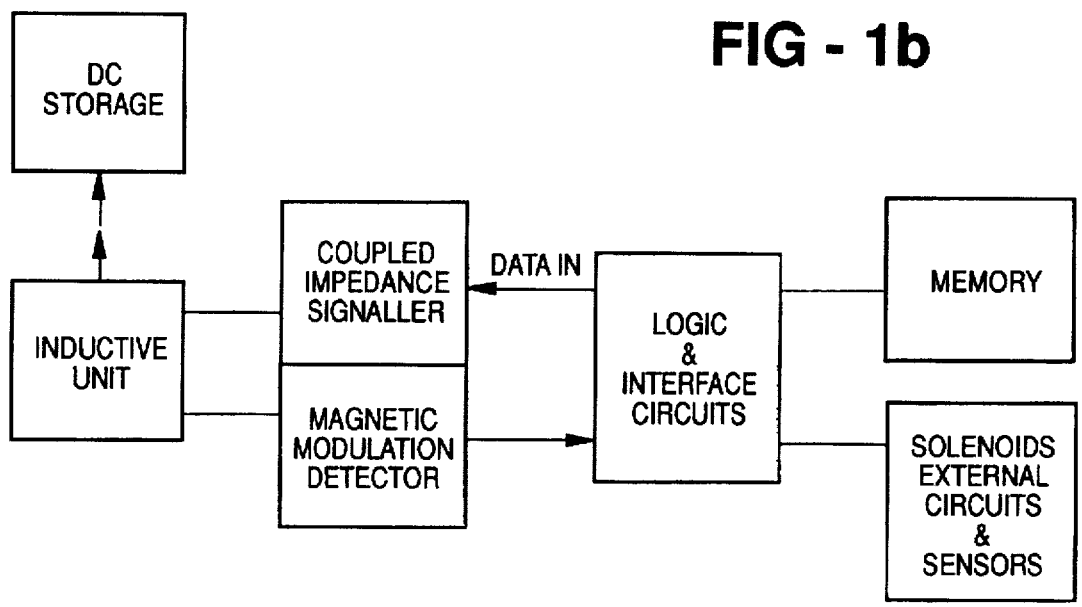

FIGS. 1A and 1B show a representation of one form of the present invention.

Activation or control of electrical or electromechanical device by a remote powering and control system can be accomplished using the present invention.

Power is transmitted inductively from the powering unit preferably by a tuned coil to a tuned pickup coil in the actuator. The energy received by the pickup coil is, when required, rectified and used to power the electromechanical device. Commands or data are sent to the actuator by modulating the inductive field. Amplitude, phase, frequency, pulse width or pulse position or other suitable modulation may be used. This provides interference free control of the actuator. The actuator communicates with the powering unit using either of two possible signalling methods:

1. Transmission of a modulated preferably RF signal generated by an oscillator internal to the actuator or;
2. By a coupled impedance signalling method to be detailed later. This allows the actuator to, for example, identify itself, indicate its present status, relay information stored and indicate action being taken. Both systems have the advantage of using the same power pickup coil on the transponder for transmitting data. The actuator may in one form be utilized on a railwagon (see FIGS. 27 to 30) where it can remotely power and control solenoid operated air valves for the dumping of minerals or grain at unmanned terminals. Communication can be provided between a central terminal and each actuator.

Figure 19:
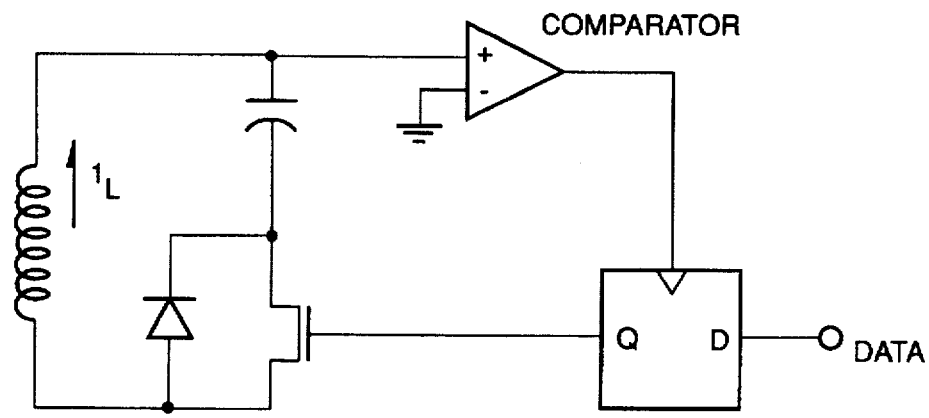
Figure 19A:
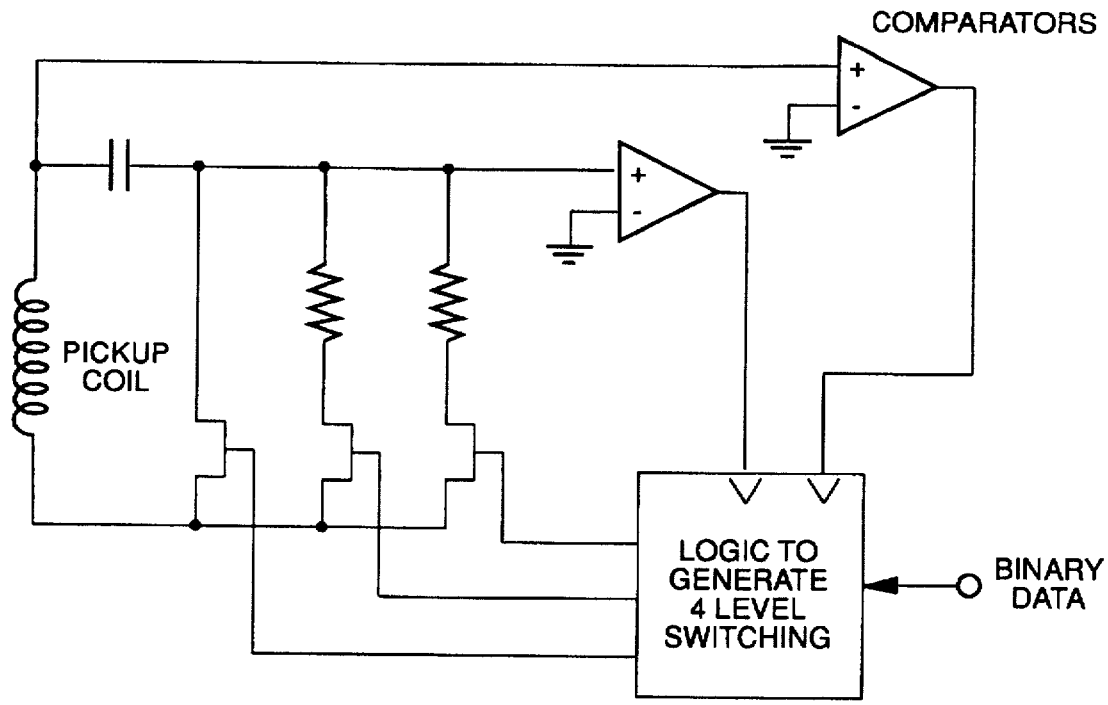
Figure 19B:
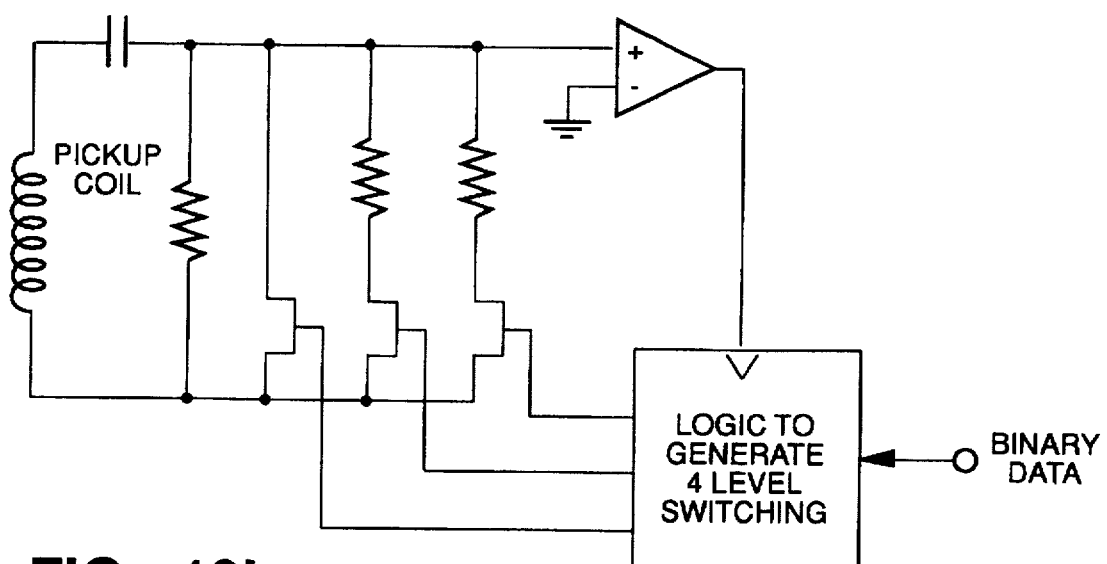
Figures 1, 19C:
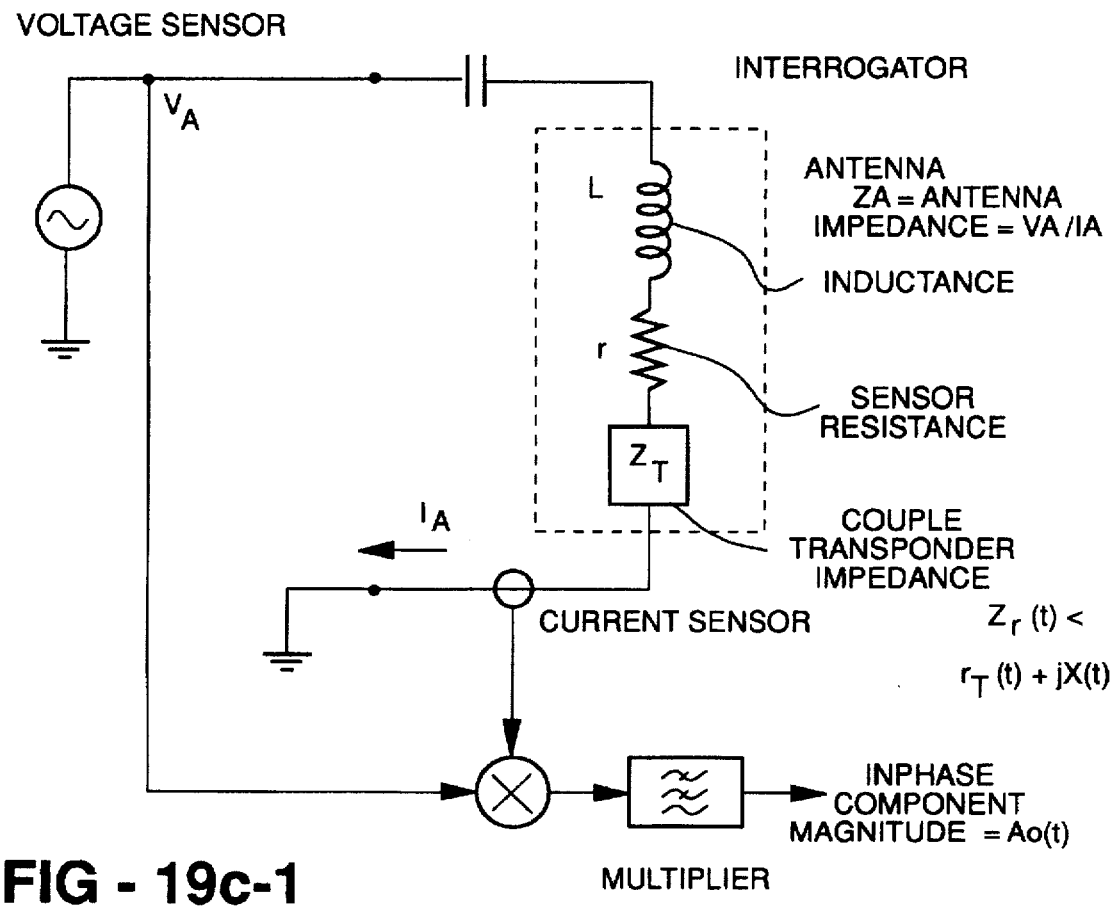
Figures 2, 19C:
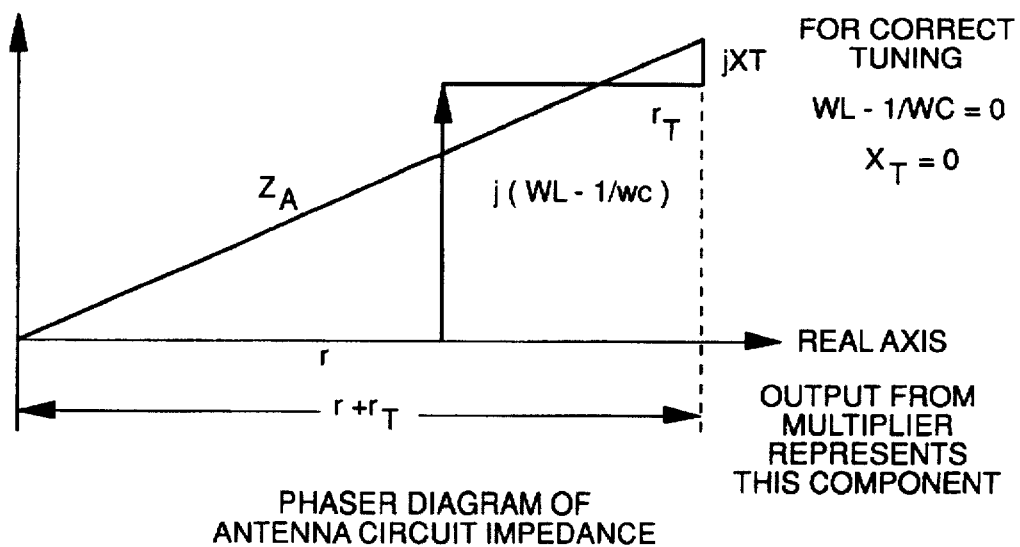

One form of coil structure is shown in FIGS. 2 and 2A. A tuned pickup coil in the actuator extracts power and timing information from the (powering) magnetic field. Command instructions can be sent to the actuator by modulation of the magnetic field. Upon receipt of a valid command sequence the actuator applies power to the appropriate solenoid or the like. Programming of memory on the actuator can also be performed by modulating the magnetic field with appropriate instructions.

By specially concatenating coils an effective long coil can be made which can control rapidly moving actuators. Concatenating coils are much more effective than simply making a longer powering coil. A longer coil has a lower field intensity for the same input voltage, however, concatenated coils maintain the field intensity. If necessary, mutual coupling between coils can be made negligible by overlapping adjacent coils cancelling the flux linkage between them. FIGS. 3 and 3A show one form of concatenating coils. Note that a magnetic field concentrator (as detailed in another patent specification by Applicant which corresponds to Ser. No. 08/499,294, filed May 18, 1990, entitled "Transponder") can be used on the actuator to enhance the inductive coupling. The concentrator increases the actuators' coil impinging magnetic field.

As aforementioned, in one form of the present invention, an ultrasonically oscillating magnetic field is generated by a resonant coil at a base station. A tuned pickup Coil in the actuator extracts power from the magnetic field. Commands or data may be sent to the actuator by modulating the magnetic field wave form. A modulation detector on the actuator receives and detects the modulation. Upon receipt of a valid command sequence the actuator can provide power to a solenoid or the like while under the influence of the magnetic field.

The actuator can also possess an oscillator, the frequency of which may be either derived from a Phase Lock Loop (PLL), a crystal or other known means. A PLL may be locked onto the period of the magnetic oscillations.

An identifying code number or any other data may be stored on ROM in the actuator while temporary data may be stored in other suitable non-volatile memory. The temporary memory may be programmed by modulating the magnetic field.

Data may be transmitted from the actuator to a base station by modulation of the oscillator's output. The transmitted data may include the actuator's identifying code number, status/bits indicating the state of various systems connected to or in the near vicinity of the actuator, specialized information stored in the temporary memory and/or other data. Transmission of data can be accomplished by the same receiver means used to receive power from the magnetic field, as will be herein later detailed. The modulated signal, preferably RF, may be transmitted by a loop antenna on the actuator to a loop antenna wound on top of the magnetic power coil at the base station. Preferentially the RF signal can be injected into the receiving means using a current source i.e. (collector of a bipolar, or drain of a field effect, transistor). The details of this method are presented in a copending patent application Ser. No. 07/499,294, May 18, 1990, entitled "Transponder". Timing or other control data may be obtained from the period of the magnetic field. Decoding of the signals makes use of this to implement matched filtering recovery of the data. Special interference subtraction circuitry may be included in the base station to reduce interfering signals.

A special magnetic field concentrator can be added to the pickup coil(s) to increase the power transfer. By carefully overlapping concatenated coils the mutual coupling between coils can be reduced to zero. This allows many coils to be driven independently and yet form a super long coil capable of activating a rapidly moving actuator.

A more particular preferred form only of the present invention will now be described. The actuator may provide sufficient power and command intelligence to control low power solenoids and the like. Because of the normally fixed orientation of the actuator, for example on a railway wagon, eleborate antenna structures required to power the transponder may not be necessary, however, applications may eventuate requiring two or three dimensional powering antenna structures detailed in a copending application Ser. No. 07/499,319 filed May 31, 1990 entitled "Powering and Communication Apparatus and Methods".

The system operates in the following manner:

An ultrasonically oscillating magnetic field is generated by a resonant coil at a base station (the driver or driving coil). The resonant frequency and oscillation phase of the coil being controlled precisely by a suitable tuning means. The driver coil can be placed beside, on top of or under the actuator, so as to influence the actuator.

The actuator possesses an antenna structure suitable for power and/or data reception and transmission, preferably a resonant pickup coil tuned to the same frequency as the driver coil. The actuator coil is mounted so that it can be influenced by the driver coil.

Figure 4:
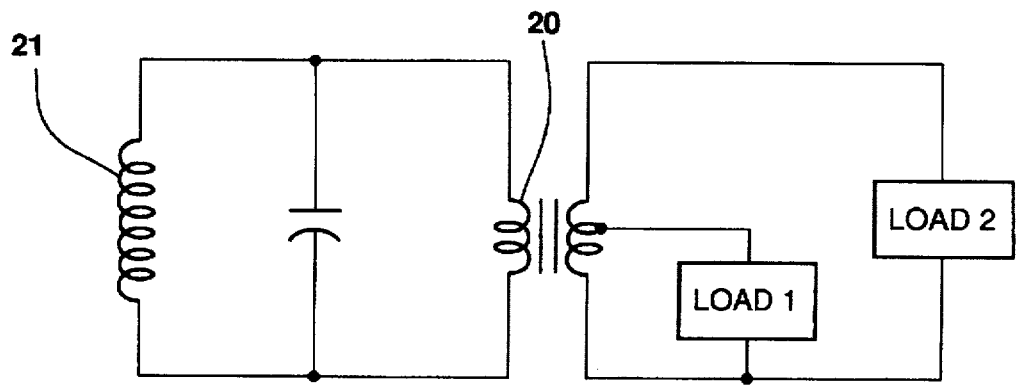
FIGS. 4, 5A, 5B and 6, show example load matching and supply voltage devices.
Figure 5A:
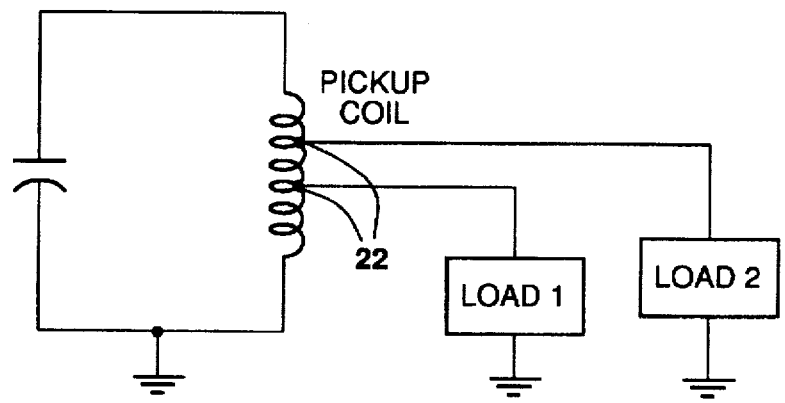
Figure 5B:
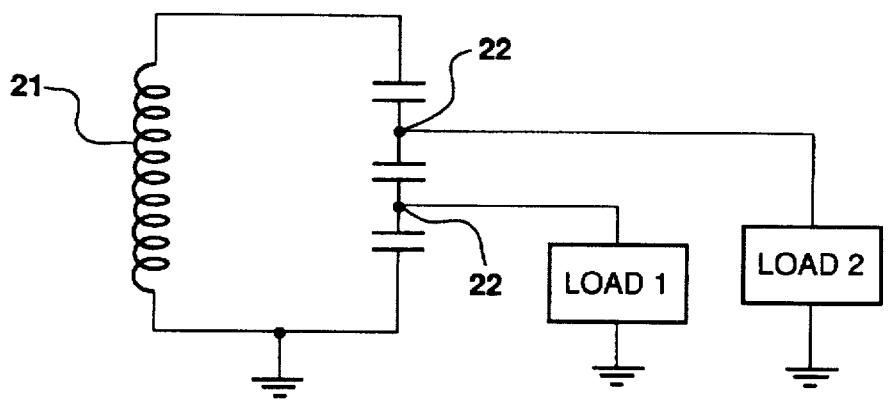
Figure 6:
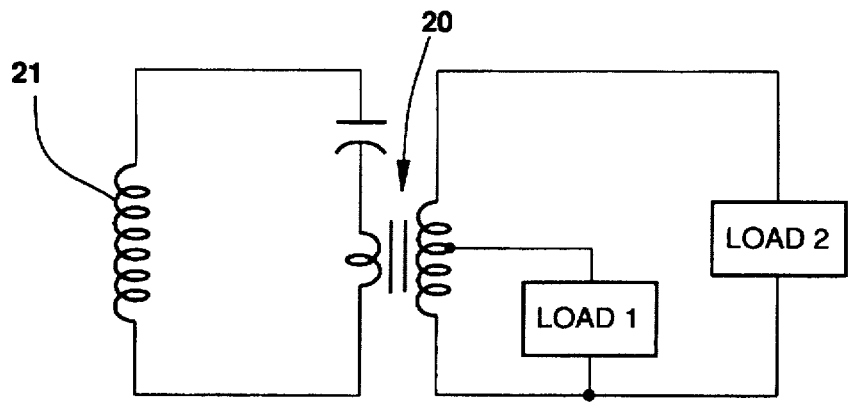

Power and/or data is transmitted by the magnetic field between the driver and actuator coils. For maximum transfer of power the impedance of the actuator's load must be matched to the actuator's tuned coil 21 resistive impedance. This is done by either using a transformer (FIGS. 4 and 6) between the load and tuned coil, by taking tappings off the tuned coil 21 at the correct points as determined by the turns ratio, or by taking tappings off the tuning capacitance. It is possible to obtain numerous supply voltages by taking the appropriate tappings 22 (FIGS. 5A and 5B).

For example, at optimum matching there might be 100V ac across a 50 turn actuator coil, i.e. 2 volt per turn. Hence a 3 turn tap gives 6V to run the logic circuitry and a 12 turn tap gives 24V to run low power solenoids.

Command instructions can be sent to the actuator by suitably modulating the powering field. By keeping the percentage modulation low the average transfer of power will only be slightly reduced (FSK modulation is preferably used to modulate the magnetic field). An appropriate modulation detector on the actuator detects and decodes the modulation. Upon receipt of a valid command sequence power is applied to the appropriate solenoid or the like (FIG. 22).

Figure 9:
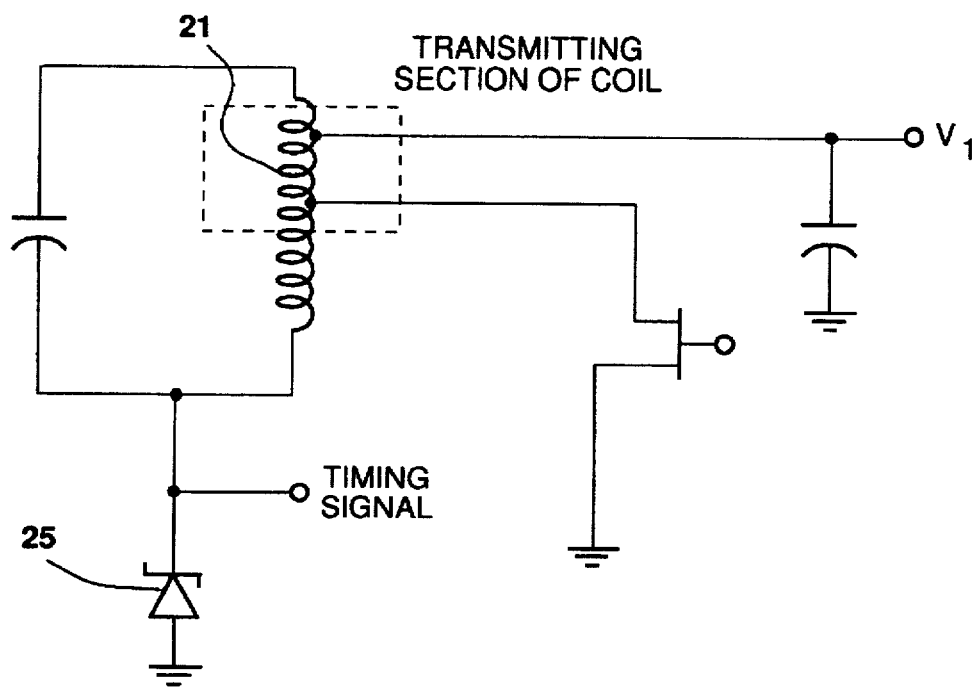
Figure 14A:
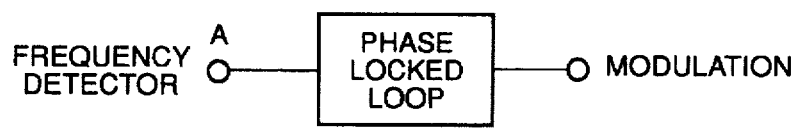
Figure 14B:
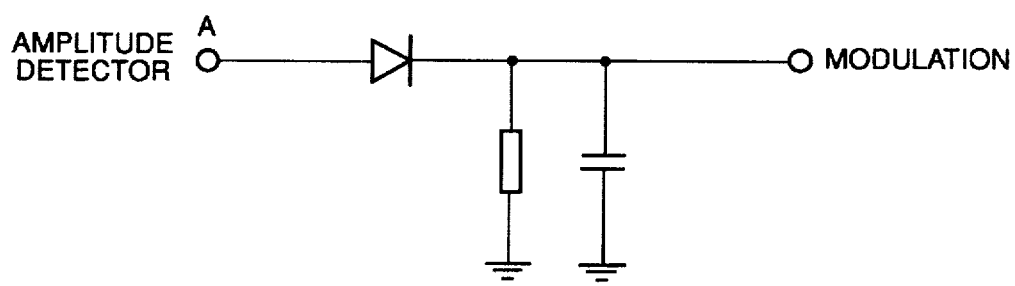

The actuator includes an oscillator, preferably RF, the frequency of which is either derived from a Phase Lock Loop (PLL) or a crystal in a known manner. The PLL frequency can be locked onto the period of the magnetic powering field. The oscillator frequency is used as a carrier signal to send data from the actuator to a base station (FIG. 9).

The actuator may include a small area of ROM (with a pre-programmed identity number or other data) and some reprogrammable non-volatile memory, such as $E^2$ PROM, for temporary storage of details relevant to the equipment upon which the actuator is mounted.

The identity number may be used to modulate the carrier signal and transmitted so that the actuator can be identified. The content of the code sequence could be made up of an identifying code, unique for that equipment, and status bits indicating the state of the various solenoids, mechanisms etc., on the equipment and what action is being taken by the actuator. Furthermore, upon receipt of a special command the contents of the reprogrammable memory could be transmitted. This would allow access to any specific information upon that equipment stored in the reprogrammable memory. Also the reprogrammable memory could be programmed by using another special command sequence followed by (or following) the data to be stored. Hence data storage and retrieval would be easy and would not interfere with the feedback and fault recognition afforded by the continuous monitoring of the system status through the normal code sequence transmission.

The coded signal is received by a loop antenna wound on top of the driver coil. To alleviate interference, a second "interference coil" may be mounted nearby but not substantially in the transmission field of the actuator transmitter. The signal from the interference coil is subtracted from the proper antenna signal cancelling any interference signal. Cancellation must be done at the carrier frequency and not the base band.

The timing clock used to generate the code modulated signal from the actuator is locked to the period of the driver coil 21. Consequently with the timing period exactly known, the techniques of matched filtering can be used to provide optimum decoding.

Actuator coil 21 effectively provides an induced powering signal upon reception of the magnetic powering field transmitted by the interrogator. A first portion of this induced powering signal is utilized to supply a first voltage supply to the logic circuitry in the actuator, while a further portion of the induced powering signal is utilized to selectively provide a second supply voltage to the externally connected solenoids in accordance with the command data transmitted from the interrogator by modulating the power field.

Figure 7:
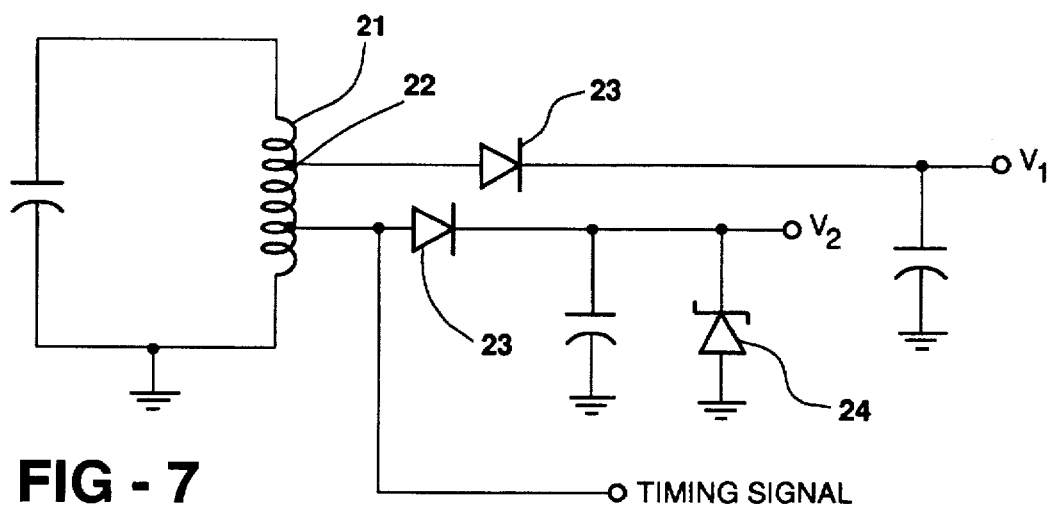

To rectify the voltage picked up by the actuator coil 21 several forms can be adopted. One form involves using a single diode 23 to rectify each necessary supply voltage and one zener 24 to clamp one of the supply lines. This will clamp all other supply rails to the turns ratio between taps (FIG. 7).

Figure 8:
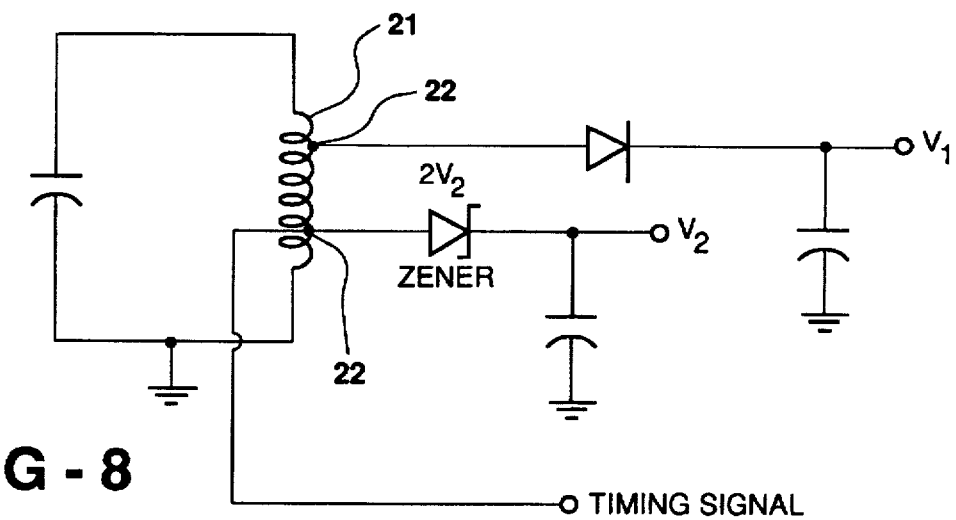
Figure 8A:
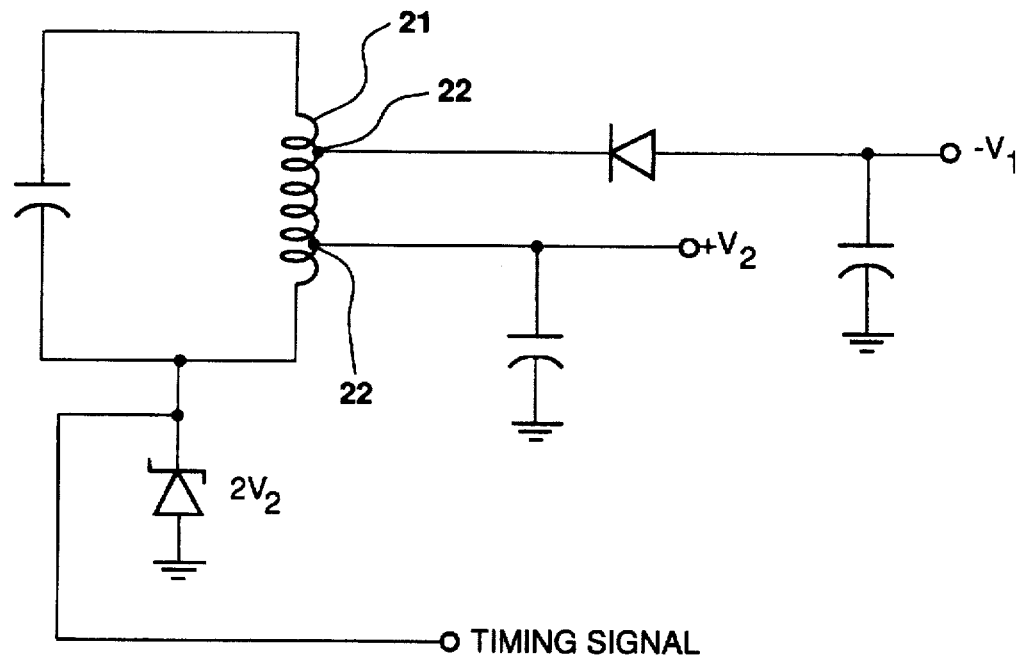

Alternatively, when only two supply voltages are required, as in the actuator, (6V for logic and 24V for solenoids), then fewer diodes may be used (FIGS. 8 and 8A).

To use part of the actuator pickup coil 21 for data transmission with an RF signal requires further modifications to the circuit of the rectifier and voltage regulator (FIG. 9). Note the diode 25 is placed between a voltage reference point (GND) and the receiving coil. A transistor is shown which acts to excite the transmitting part of the coil. The details of how this type of coil/diode structure functions have been disclosed in a copending patent application Ser. No. 08/499,294 filed May 18, 1990, entitled "Transponder".

To provide security against accidental actuation the commanding operation could necessitate the use of the identifying code number for the actuator as a necessary part of any command sequence. This would make accidental triggering virtually impossible.

The method of modulation used for the actuation control function may be frequency shift keying (FSK) or phase shift keying (PSK). For small frequency or phase changes there is no significant reduction in the average transfer of power. By keeping the percentage modulation low for amplitude modulation or the duty cycle low for pulse type modulation the average transfer of power will only be slightly reduced. A synchronization pulse (or blank) is used to indicate the end (or beginning if designed) of a command sequence. Pulse width modulation with a teletype synch pulse may be used to transmit data from the actuator to the receiver.

The frequency and phase of the driver coil can be precisely controlled by a saturable reactor i.e. variable inductance. Part of the driver coil is wound onto a pair of high permeability toroids. A dc magnetic field is applied to each toroid. The dc field is oppositely directed in each toroid with respect to the ac field due to the driver coil current. A strong dc field will saturate the core reducing the toroid's inductance to that of an air cored toroid. By controlling the strength of the dc field the resonant frequency and phase of the driver coil can be precisely controlled (FIG. 10A). Alternatively, an electronically variable capacitor can be used to precisely control the phase and frequency of the driver coil current. Electronic switches connected across or in series with some of the coil's tuning capacitors, are periodically opened or closed changing the total tuning capacity of the coil's tuning capacitors. See FIG. 10B.

The magnetic field threading the actuator pickup coil can be enhanced by placing a conducting (but preferably non-magnetic) metal skirt around, and in close proximity to, the coil (concentrator, as described in a copending patent application Ser. No. 08/499,294, filed May 18, 1990, entitled "Transponder"). The skirt must not be a closed circuit but must have an electrical break to prevent currents circulating around the coil (FIGS. 12 and 12A).

By overlapping two coils just sufficiently to cancel their mutual magnetic coupling the coils can be operated independently of each other. Many coils can be concatenated in such a manner and each operated independently of its neighboring coils. Such a super long coil could be used to generate a greatly extended magnetic field suitable for actuating or programming rapidly moving actuators. Alternatively the mutual coupling between coils can be ignored where a set of concatenated coils are all connected together to the same coil driver.

One form of communication advantageously adapted for use with the present invention will now be detailed. Full duplex magnetic signalling incorporates a combination of a Magnetic Field Modulation System (MFMS) and a Coupled Impedance Signalling System (CISS) to be hereinafter described. MFMS can be utilized between the base station and the actuator, for providing power and/or communication to the actuator. CISS can be utilised for providing a relatively interference free communications from the actuator to the base station.

MFMS includes a method of transmitting data and power from a base station to an actuator or other device using an inductive field. MFMS as applied to a transponder has also been disclosed in a copending patent application Ser. No. 07/499,294.

Data or command instructions can be transmitted by modulating an oscillating magnetic field. The oscillating field is used to transmit power to an inductively coupled tuned receiving unit. The receiving unit might be an actuator. A modulation detector at the tuned receiving unit detects the modulation and presents it to appropriate decoding circuitry.

For an arbitrarily modulated oscillating magnetic field, the data rate is limited by the bandwidth of the tuned receiving unit. This is sufficiently large to allow a data rate of kilobits per second. Bit rates well in excess of the tuned receiving units bandwidth can be achieved by using multi-level signalling. The channel capacity is limited (according to Shannon) by the bandwidth and the logarithm of the signal to noise ratio. The signal to noise ratio for the modulated magnetic field is exceedingly high and bit rates are essentially limited by the complexity of ccircuitry required to properly decode the signals. Typically the magnetic field is phase or frequency modulated because these do not appreciably affect the power transmission from the transmitter to the receiving unit. Amplitude, pulse width or pulse position modulation can also be used. Amplitude or pulse modulation, however, reduces the average power transmission. Amplitude modulation also can be distorted by voltage regulation circuitry for limiting the voltage across the tuned receiving unit.

At the receiving unit, a Phase Locked Loop 30 (PLL) extracts the phase or frequency modulation, whereas an envelope detector can be used to detect amplitude or pulse modulation, as shown by example in FIGS. 13 and 14, 14A and 14B.

Figure 15:
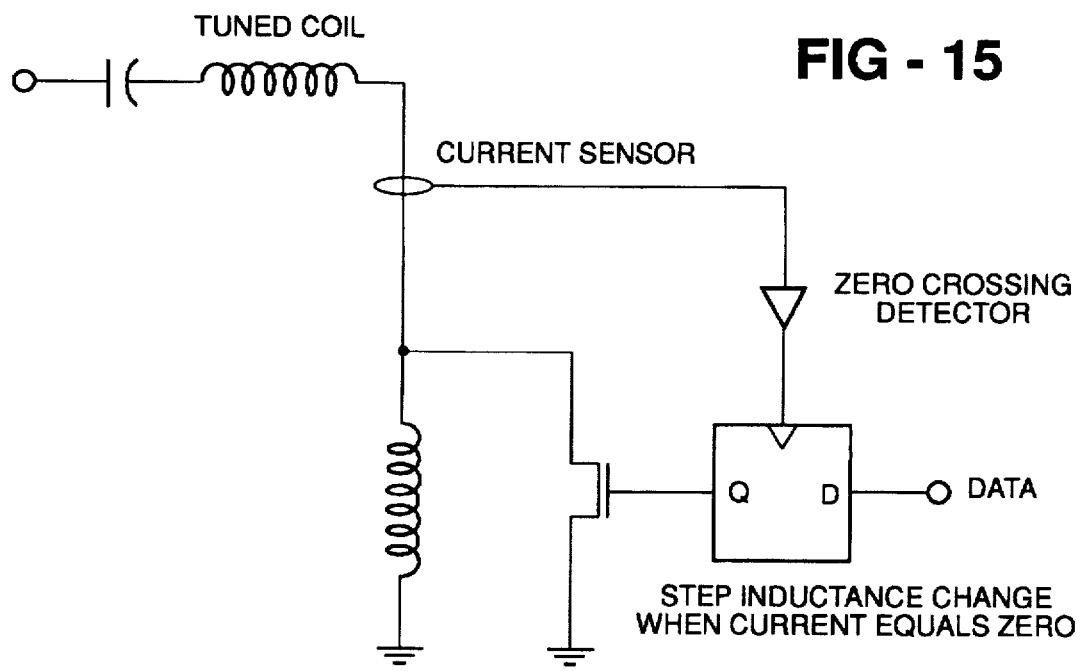
FIGS. 15 and 16 show example coil switching forms for tuning.
Figure 16:
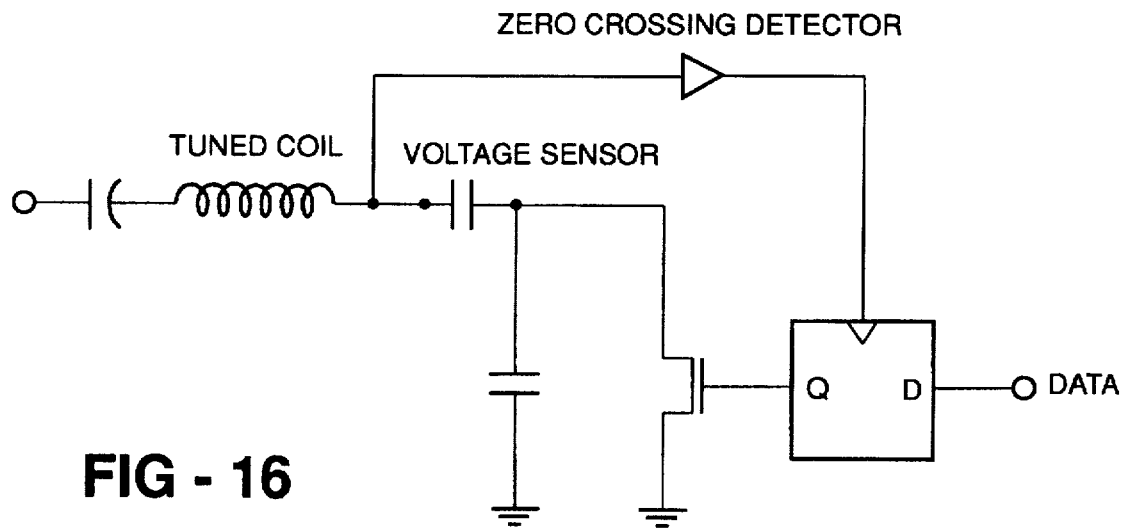

The powering field is generated by a tuned coil 21. Tuning is essential for supplying large coil currents at low input voltages. A high Q coil is used to ensure efficient operation. The intrinsic properties of high Q tuned coils require special attention if high speed modulation of the magnetic field is desired. For phase or frequency modulation, the instantaneous operating frequency of the tuned coil is changed by either a step change in the coil inductance or tuning capacitance. Any step inductance change should occur when the coil current is zero while any step capacitance change should occur when the capacitor voltage is zero or such that the capacitance voltage does not change when the capacitance value changes. These switching schemes minimize circuit transient responses, as shown by example in FIGS. 15 and 16. The step change in circuit capacitance or inductance can be realized by switching a capacitor or inductor into the circuit during the whole time that the extra capacitance or inductance is required. Alternatively, the capacitor or inductor can be periodically switched in during a portion(s) of each cycle of the coil current. By varying the relative size of the portion(s) with respect to the period of a cycle the capacitance or inductance value can be varied in similar proportion. This allows accurate control of the coil's resonant frequency and operating phase.

For phase modulation, the phase angle slips at a linear rate when a step frequency change is made. When the required phase angle slippage is reached the operating frequency is returned to its nominal value and the phase slippage ceases.

Figure 17:
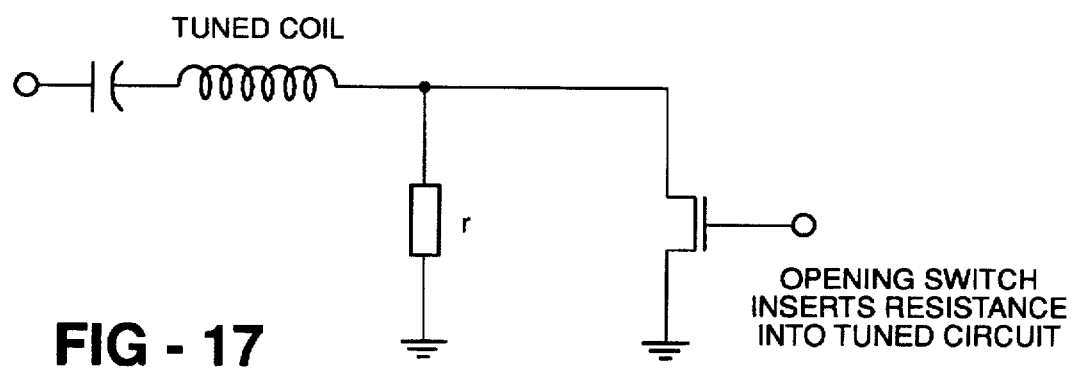
FIGS. 17, 17A and 17B show example Q retarding configurations.
Figure 17A:
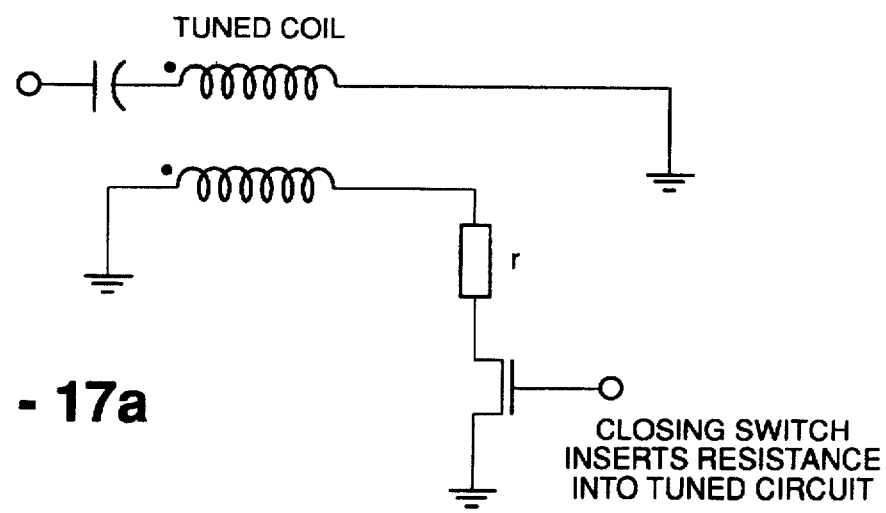
Figure 17B:
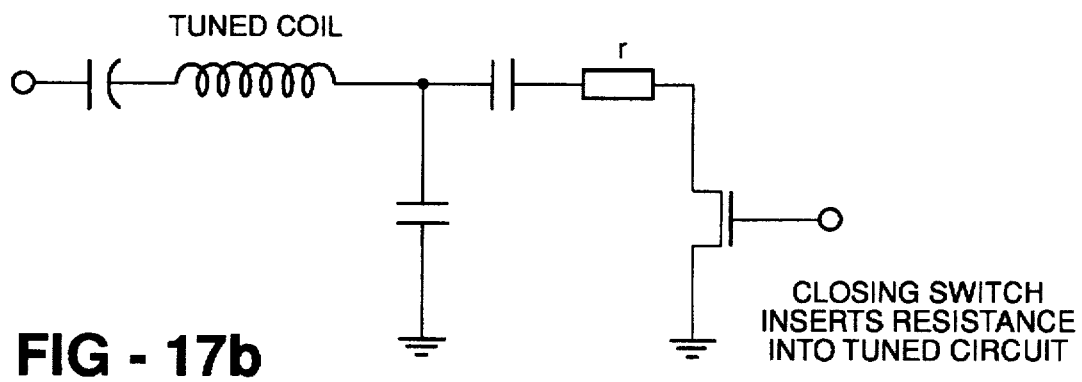

When amplitude or pulse modulation is used, the coil Q mitigates against rapid changes in the coil current. The coil Q can be artificially lowered by inserting extra loss in to the coil. This is done by either directly, inductively or capacitively coupling extra resistance in to the tuned circuit as shown by example in FIG. 17. For amplitude modulation, reductions in the coil current magnitude can be speeded up by switching in an extra resistor. For pulse modulation, the resistor is connected after the signal source has been disconnected. The resistor rapidly quenches the coil current. After the appropriate time interval has elapsed the signal source is re-activated and the coil current is re-established. For amplitude or pulse modulation, the resistance can be replaced by a power supply so that, instead of dumping the magnetic energy as heat, it is returned to the power supply for reuse. The simultaneous action of power transfer and data or command transmission by the same magnetic field may allow the remote control of electromechanical devices and electronic circuits and/or the remote programming of E²PROM or conventional CMOS memory with battery backup or other memory or circuitry within the actuator.

CISS includes a method of signalling which allows data to be simultaneously transmitted from an inductively powered receiving unit back to a magnetic field transmitting unit while the unit is receiving a magnetic powering field.

Power is transmitted inductively from a tuned powering coil, in the transmitting unit, to a tuned pickup coil in the receiving unit. Variations in the electrical parameters of the pickup coil inductively couple back to the impedance of the tuned powering coil. The current induced in the pickup coil, by the interrogator's magnetic field, generates its own magnetic field. This field induces a voltage in the interrogator's driver coil. The induced voltage has an in-phase and a quadrature phase component with respect to the driver coil's current. This is a non-radiative signalling method and uses the same coil for both the inductive powering of the receiver unit and the reception of data from the receiver unit. Inductive coupling provides relatively interference free communication.

There are two methods by which data can be signalled from the receiving unit:

(1) "Power Absorption" signalling monitors the power being absorbed by the receiving unit. Modulation of the power being absorbed by each receiving unit is detected at the base station.

(2) "Impedance Monitoring" monitors the impedance of the tuned powering coil by comparing the phase angles of the current and voltage in the tuned powering coil. The impedance can be inductively modified by the tuned pickup coil. Modulation of the tuned pickup coil's parameters results in modulation of the impedance of the tuned powering coil.

For both of these signalling methods the data rate is not limited by the bandwidth of the powering coil and is substantially not limited by the pickup coil's bandwidth. Moreover, the efficiency of power transmission from the transmitting unit to the receiving unit is only marginally affected by these signalling methods. CISS utilized the same carrier frequency for data transmission as the powering field. The data transmission can be coherently detected using the powering fields frequency source as the coherent reference. Coherent detection is an optimum detection method for sinusoidal carrier signals. The coherent detector(s) can be adjusted to detect either the in-phase (I) signal (Real current or voltage) or the quadrature (Q) signal (reactive current or voltage).

Furthermore, while CISS is being used the frequency of the powering field can simultaneously be used to transmit data into the actuator, preferably by FSK'ing of the powering field's frequency.

(1) POWERING ABSORPTION SIGNALLING:

Power absorbtion signalling works by monitoring the real (or in-phase) currents and voltages in the driver coil. These correspond to the power dissipation in the driver coil and the actuator. The pickup coil must be tuned to substantially the frequency of the inductive powering field. Energy is dissipated in the receiver by the coil losses and the circuit load. By deactivating the pickup coil the extraction of energy from the driver coil to satisfy this energy dissipation ceases. By correctly synchronising the deactivation and activation of the pickup coil with the powering field, the energy stored in the pickup coil is substantially retained in the pickup coil. Upon reactivation of the pickup coil, the coil continues operating under the steady state conditions existing prior to deactivation. Consequently, the power absorbed is immediately equal to the full absorption value. There is no transient period during which time the system runs up to the steady state operating point. Activation and deactivation of the pickup coil is achieved by open circuiting the connection between the pickup coil and its tuning capacitor.

Figure 18:
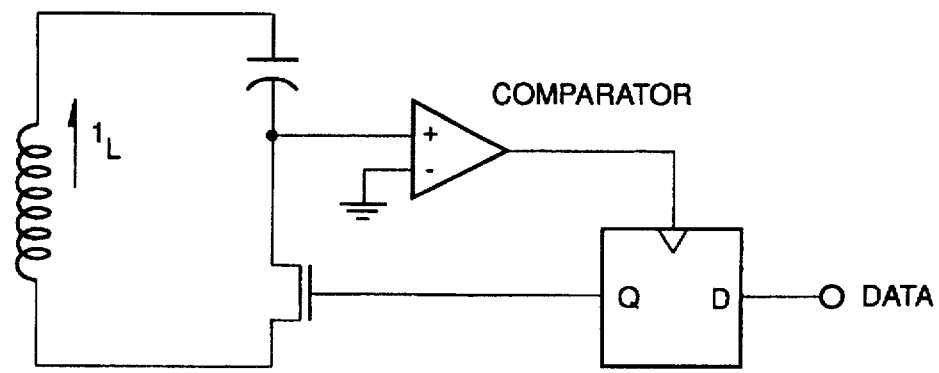
FIGS. 18, 19, 19A, 19B, and 19C show example circuits used with power absorption signalling.

Deactivation of the pickup coil should occur when the inductor current is substantially zero. While re-activation should occur when the pickup coil's voltage is substantially zero, and such that the resulting current flow is in phase with the voltage induced in the pickup coil by the magnetic powering field. Activation and deactivation of the pickup coil may be implemented using a switch. FIG. 18 and shows an example circuit which synchronizes the deactivation of the coil at the point at which the coil current is substantially zero. When a diode is connected across the switch then provided the semiconductor switch is turned off after the coil current $I_L$ has gone negative, the turn off will be synchronous with the point at which the inductor current is zero. The comparator in FIG. 18 monitors the current flowing through the semiconductor switch by measuring the voltage drop across the impedance of the switch.

FIG. 19 shows an example circuit which synchronises the turn-on of the semiconductor switch such that the coil current then flows in phase with the induced voltage. The voltage comparator monitors the coil's induced voltage. When said modulation of the circuits in FIGS. 18, 19 and 19A is occurring the frequency of the powering field can simultaneously be used to transmit data into the actuator. Substantially no transients will occur when the circuits of FIGS. 18, 19 and 19A are switched. Multi-level signalling can be implemented by modulating the series resistance of the pickup coil. Implicit to the circuits shown in FIGS. 18, 19 and 19A is the series resistance of the coil. This resistance is the source of the coil losses. Switching extra resistance in series with the coil reduces the coil dissipation which is monitored by the interrogator. FIG. 19B shows a system for implementing 4 level signalling.

This method of correctly synchronising deactivation and activation of the tuned pickup coil by open circuiting the series tuned circuit provides an extremely rapid signalling system that is not restrained by the tuned coils bandwidth. Other disclosed systems wherein a variable resistance or variable reactance element is used to modulate the current in the tuned pickup coil are limited in data rate by the bandwidth of the tuned pickup coil. Furthermore, none of these systems increase their bit rate beyond the bandwidth limit by using multi-level signalling.

Proper synchronous switching is not as critical with multi-level resistive signalling. The switching rate is limited by the tuned bandwidth. By continuing to follow the described synchronous switching procedures transients due to stray or parasitic circuit elements are minimized. Even though the switching rate is limited by the tuned circuit's bandwidth, multi-level signalling gives a higher effective bit rate than could be achieved using binary signalling.

Variations in the power absorbed by the receiver can be monitored at the base station as changes in the real impedance (resistance) of the driver coil. The in-phase component of the current flowing into and the voltage across the powering coil can be monitored to detect the power absorption modulation (see FIG. 19C). The transponder impedance coupled back into the interrogator antenna is $Z_T(t)$ (see FIG. 19C). The output product of the multiple is Ao(t).

$$Ao(t) = \frac{V_A{}^2(r + r_T(t))}{(r + r_T(t))^2 + (X(t) + \omega L - 1/\omega C)^2}$$

If the transponder is correctly tuned $X(t)=0$, and if the series tuned interrogator is likewise correctly tuned then $\omega L - 1/\omega C = 0$. Hence $$Ao(t) = \frac{V_A{}^2}{r + r_T(t)}$$

and Ao(t) is an effective measure of $r_T(t)$. For power absorption signalling, pulse position modulation or pulse amplitude modulation with the pickup coil only deactivated substantially during short pulses, is preferred because it only marginally reduces the power received by the pickup coil.

(2) IMPEDANCE MONITORING:

Impedance monitoring measures both the real and the reactive current and voltage components in the interrogator antenna i.e. the in-phase and quadrature components. From this information a measure of the transponders tuned circuit's current magnitude and phase angle with respect to the magnetic field is constructed. Data is used to modulate the magnitude and/or phase angle of this current.

The pickup coil is tuned to, or close to, the same frequency as the inductive powering field. The total impedance of the tuned powering coil is a function of the powering coil's impedance, the mutual coupling between these two coils, the pickup coil's inductance and tuning capacitance, the circuit losses in the receiving unit, and the operating frequency. Varying any of these parameters will change the total impedance of the powering coil. The most readily varied parameter is the pickup coil's tuning capacitor. Changing the tuning capacitance changes the impedance of the powering coil and by correctly synchronising these changes, transients normally associated with these changes can be substantially eliminated. The total impedance of the powering coil shifts to the new steady state impedance as rapidly as the tuned pickup coil does. With correct synchronization this is nearly instantaneous.

Figures 1, 20:
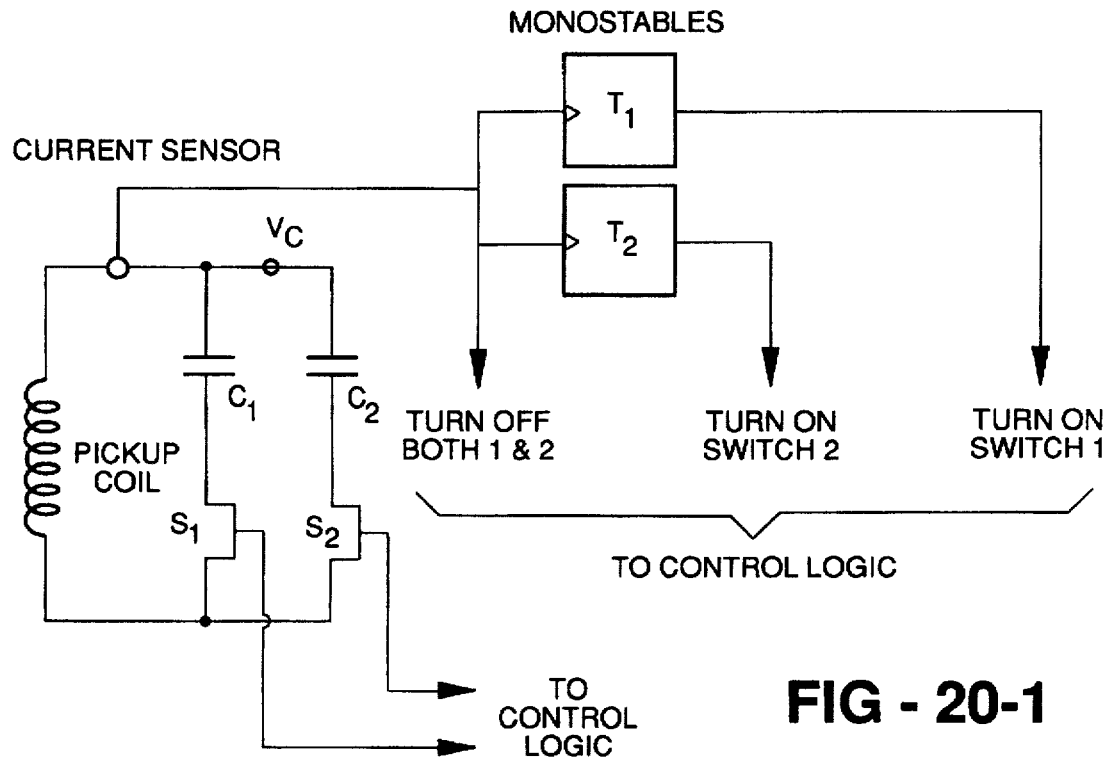
Figures 2, 20:
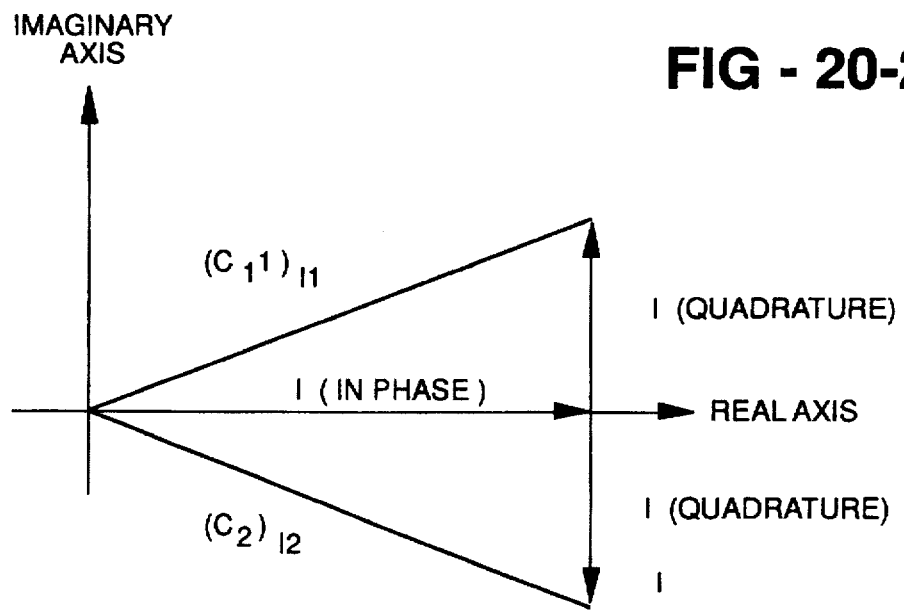

An example of a circuit for the correct synchronization of the capacitance change is shown in FIG. 20. The tuning capacitors C1 and C2 are such that C1 tunes the pickup coil to one phase angle while C2 tunes the pickup coil to a different phase angle. S1 and S2 are switches which when both opened, deactivate the pickup coil. At anytime only one switch is ever closed. The switches are opened while the coil current $I_L$ is zero in exactly the same manner as the "Power Absorption" signalling hereinbefore described. Reclosure of the appropriate switch is dictated by the appropriate steady state phase angle of the system after closure. The time of reclosure is such that the resulting current flow is in phase with the steady state current flow for that particular switch.

The switched capacitors behave like two separate "Power Absorption" transmitters with the energy stored in the system being cycled between the pickup coil and the appropriate capacitor and then being stored on that capacitor while the other capacitor is switched in. A phase sensor, not shown in FIG. 20, would control the points at which the capacitor switches would be reclosed.

Figure 20A:
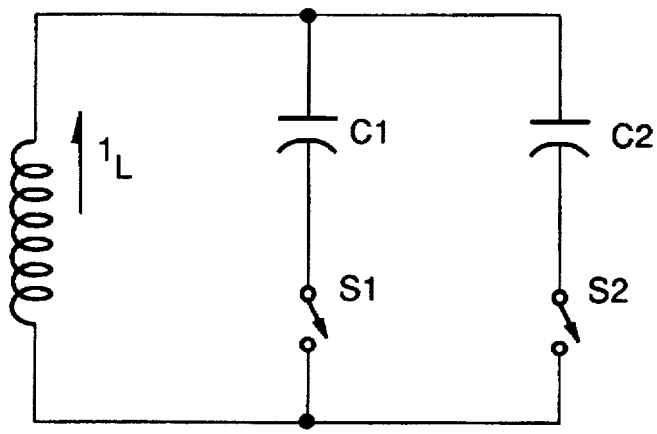
Figure 20G:
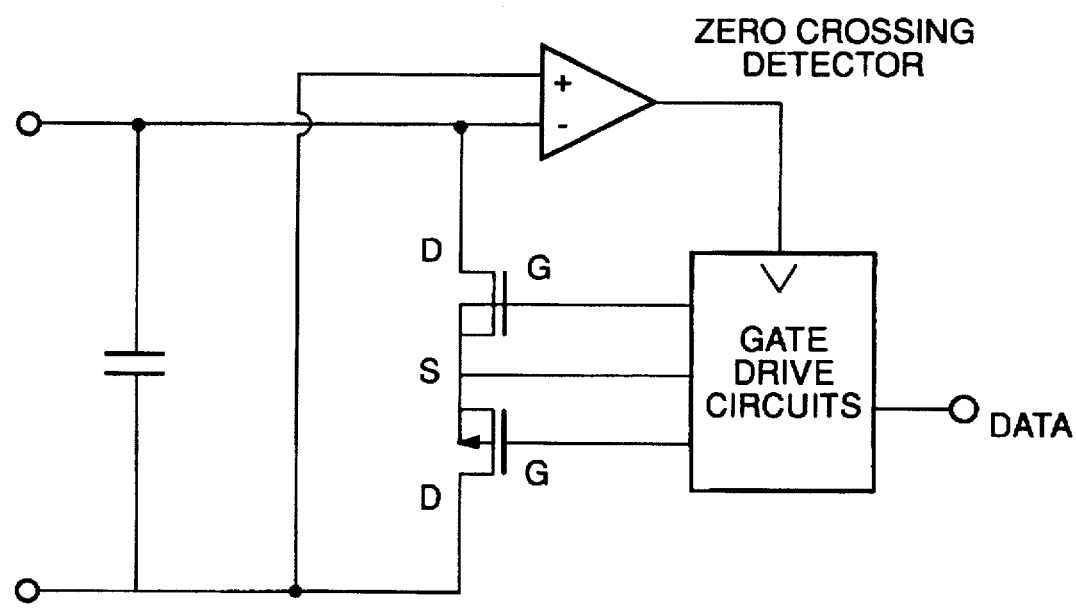
Figure 20B:
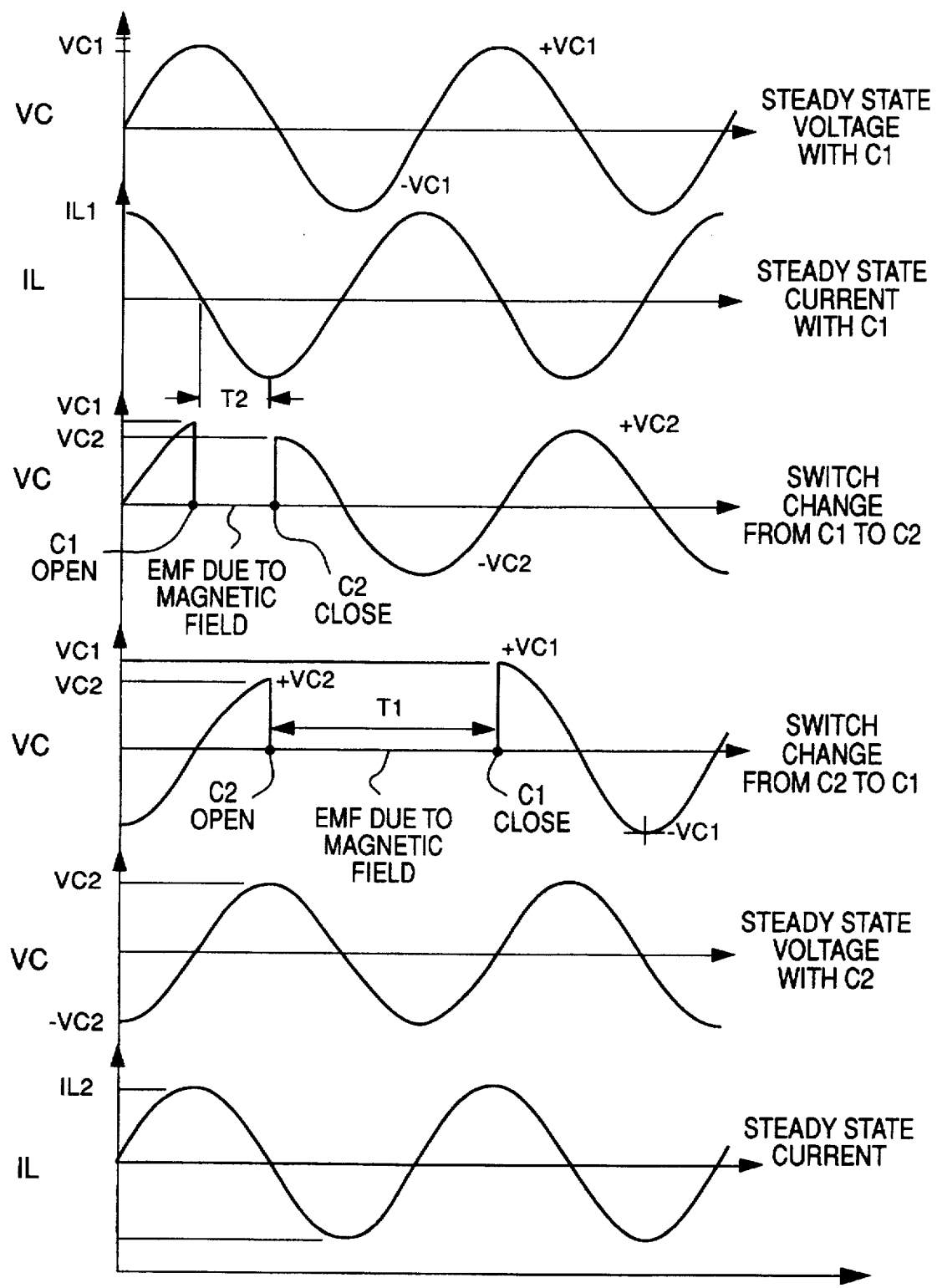
FIG. 20B shows example waveforms for the circuit of FIG. 20A

This phase sensor could be a variable delay monostable, designed to reclose the respective switch at the appropriate instant i.e. that instant when the coil current is zero in the steady state and the resultant current flow is properly in phase. FIG. 20A shows an example of such a circuit. Normally there is a transient associated with any change in circuit parameters or stored energy. However here each capacitor is charged up with exactly the correct amount of energy for the respective operating conditions of the tuned coil. Upon reclosure at the proper instant the tuned system immediately establishes its steady state conditions with negligible circuit transients. Stray or parasitic circuit elements will contribute to some minor circuit transients. FIG. 20B shows example waveforms for the circuit shown in FIG. 20A.

This switched capacitor system can be expanded to include a multiple of capacitors for multi-level signalling wherein the transition to the new operating condition occurs within a cycle (FIG. 20C). Such a system not only possesses an exceptionally high switching rate (baud rate) not limited by the bandwidth of the tuned circuit but given by:

BR=3.32B log μ where BR, B and μ are the bit rate, the baud rate and the number of levels respectively. By way of example a four (4) level signalling scheme doubles the bit rate.

For the switched capacitor circuits one of the switches can preferably be a depletion transistor such that it is normally conducting and allows the tuned circuit to function normally when the magnetic powering field is first applied. The capacitor associated with this transistor preferably can be the capacitor required for perfect tuning of the pickup coil. This ensures the system collects the maximum power possible during power up and/or when no modulation is being sent (see FIG. 20C).

If transient settling times associated with the tuned pickup coil's bandwidth are tolerable then modulating the tuning reactance, synchronously preferably, with data will modulate the phase and amplitude of the pickup coil's current. A transient will occur because the steady state energy stored in the tuned circuit varies with the reactance. Inductors or capacitors can be switched into the tuned circuit to vary the phase/amplitude of the pickup coil current. The bandwidth can be artificially widened by inserting extra resistance (lowering the Q) into the tuned system. Synchronous switching is preferable but not essential (see FIG. 20D). Multi-level signalling can be realized by paralleling a series of switched reactances. However, where transients are tolerable there is a much more efficient method of controlling the phase angle of the tuned pickup coil's current.

Figures 1, 20E:
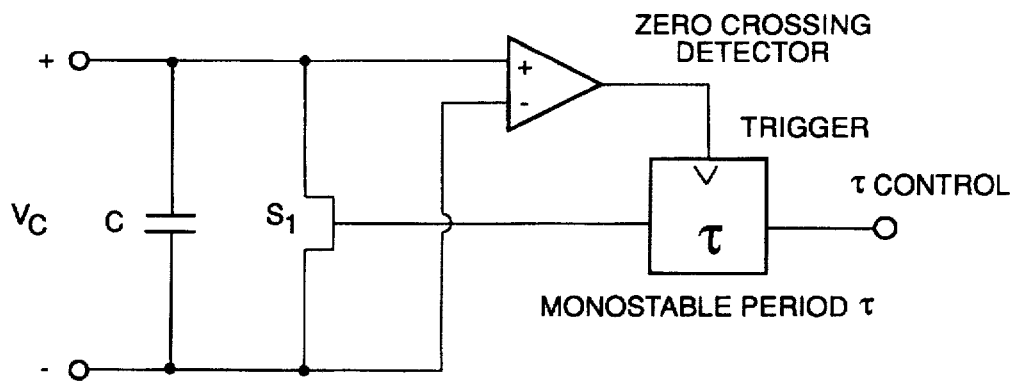
Figures 2, 20E:
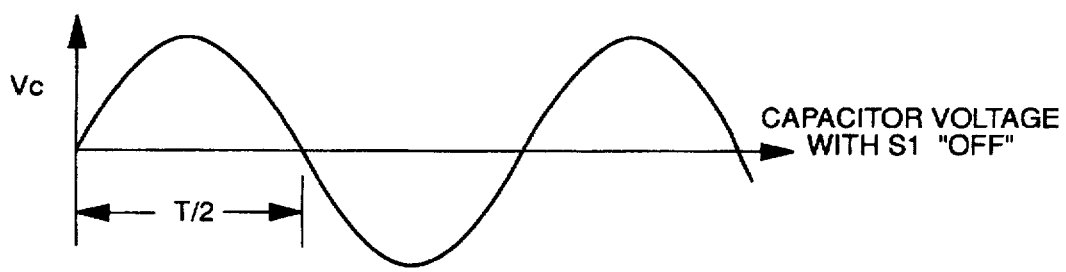
Figures 3, 20E:
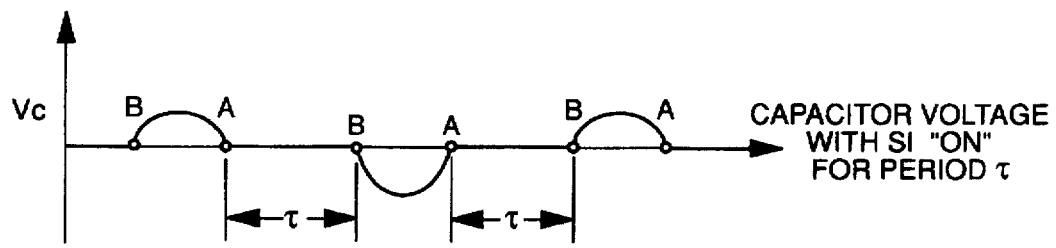
Figures 4, 20E:
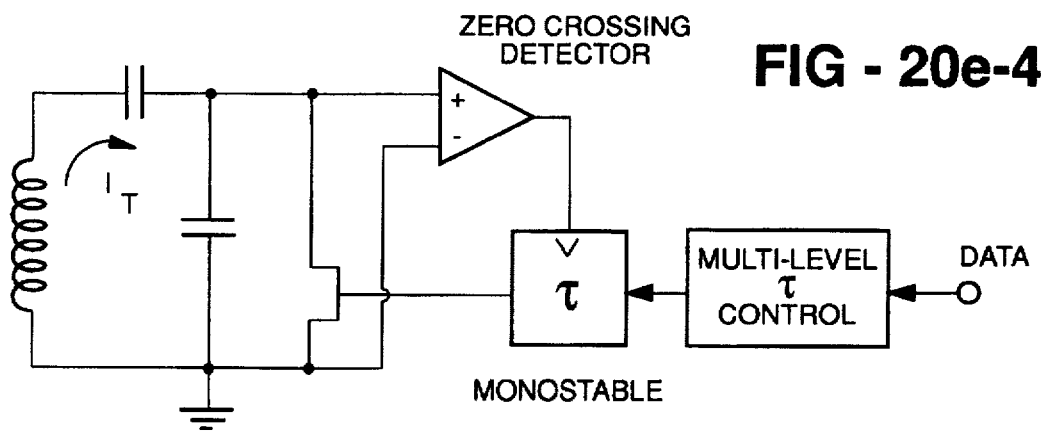

A single variable capacitor is used to control the current's phase angle and magnitude (the phase angle and amplitude being related). However, typical electronic variable capacitors (varactors) are only capable of handling a few volts of signal and are completely useless for high power/voltage systems. Instead the electronically variable capacitor utilized for tuning the interrogator antenna during FSK'ing of the powering field can be advantageously used in the transponder. The electronic capacitor together with typical waveforms and a transponder is shown in FIG. 20E.

The switch $S_1$ shorts out capacitor C periodically during each cycle. Ideally $S_1$ is a bi-directional switch with zero impedance when closed (ON) and infinite impedance when open (OFF). Such a switch can practically be realized using FET or MOSFET transistors. The switch only opens or closes when the voltage across the capacitor is zero. The time that $S_1$ remains closed $\tau$ is controlled by a monostable. The effective capacitance value $C_{ef}$ is increased by this scheme and varies from $C_{ef}=C$ at $\tau=0$ to $C_{ef}=\infty$ when $\tau=T/2$. Where $C_{ef}$ is measured by the fundamental component of voltage across the capacitor switch combination. By controlling τ with a data signal the data signal can be modulated onto the pickup coil's current phase angle. Control of the phase angle through τ is a continuously variable monotonic function. Multi-level data can be modulated onto the current phase angle by correctly choosing multi-level values for τ. The circuit can also serve to tune the transponder pickup coil when first installed. The quiescent value of τ can be set-up to correctly tune the pickup coil. When τ is varied (by data for example) the circuit will take time to settle at its new operating point. This transient tune is roughly 1/(Π×Bandwidth Tuned Circuit).

MOSFET transistors normally contain a body diode. Switching with a shunt diode has already been detailed and is shown in FIGS. 18A and 20A. The diode rectifies the waveform and introduces a dc bias across the capacitor. When the capacitance is changed (by vary τ) the dc level shifts and will take time to settle. Thus settling time is of the order of (1/Π×Bandwidth). By connecting a p-channel and an n-channel MOSFET transistor in series to implement the bidirectional switch this rectification does not occur. Special gate drive circuitry would be needed to correctly switch the MOSFETS. FIG. 20G shows this combination of MOSFETS.

Figures 1, 20F:
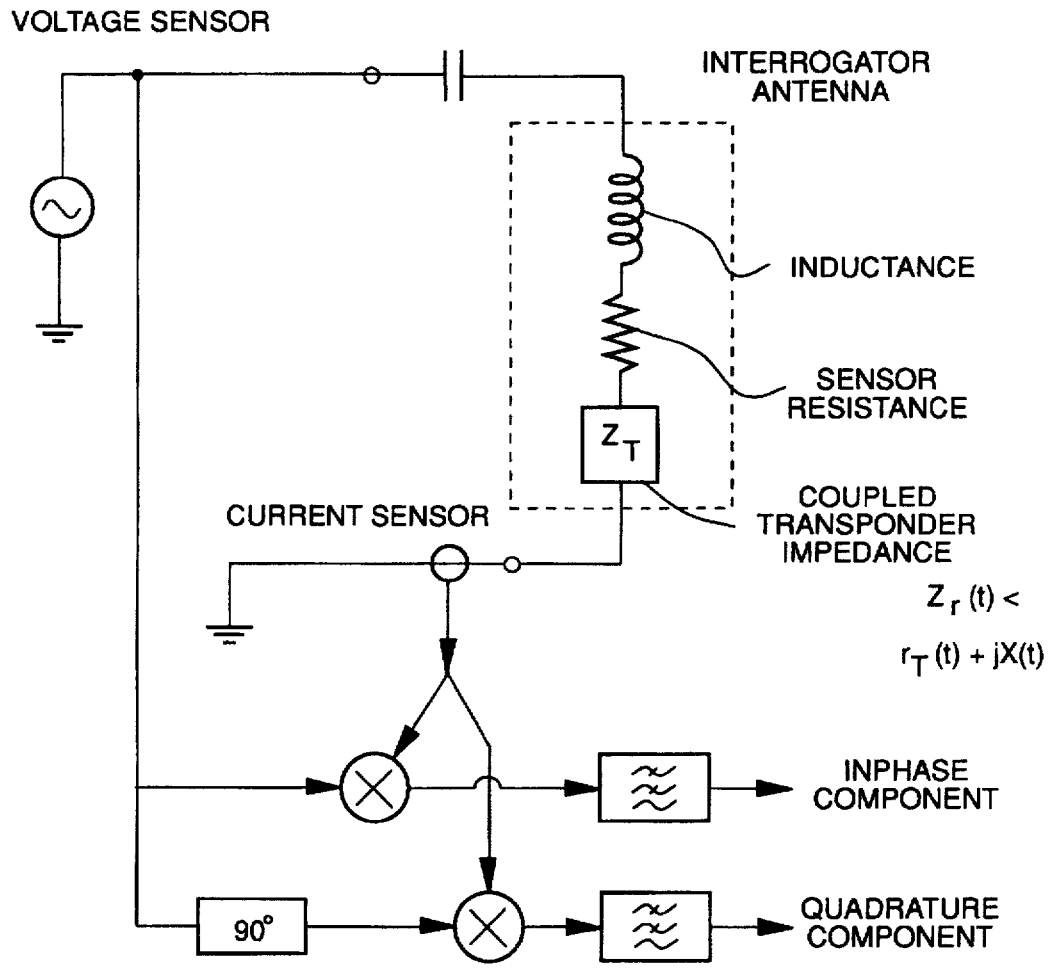
Figures 2, 20F:
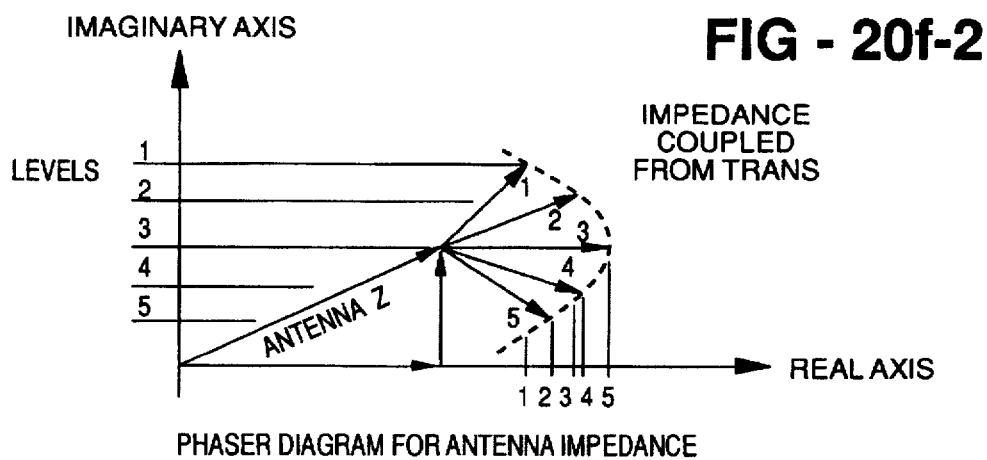

Detection of the coupled impedance is effected by monitoring the in-phase and quadrature current or voltage components in the interrogators antenna. The choice depends upon the impedance of the antenna's signal source. A voltage source requires current sensing and a current source voltage sensing. FIG. 20F shows a circuit for detecting the in-phase and quadrature coupling from the transponder and a phaser diagram for the antenna impedance. Notice that the reactive or quadrature vector monotonically changes with phase angle whereas the real or in-phase component is not a monotonic function of phase angle. The quadrature component can be decoded to reconstruct the multi-level data. The in-phase component can still be used for decoding purposes to improve the overall accuracy by defining a two dimension vector point rather than a line in the decoding space.

The interrogator antenna is preferentially tuned to operate efficiently and/or to match its electrical parameters to the signal source. As already outlined, tuning is preferentially done with an electronically variable capacitor detailed above and shown in FIGS. 10B, 20E or 20G.

Figures 1, 20H:
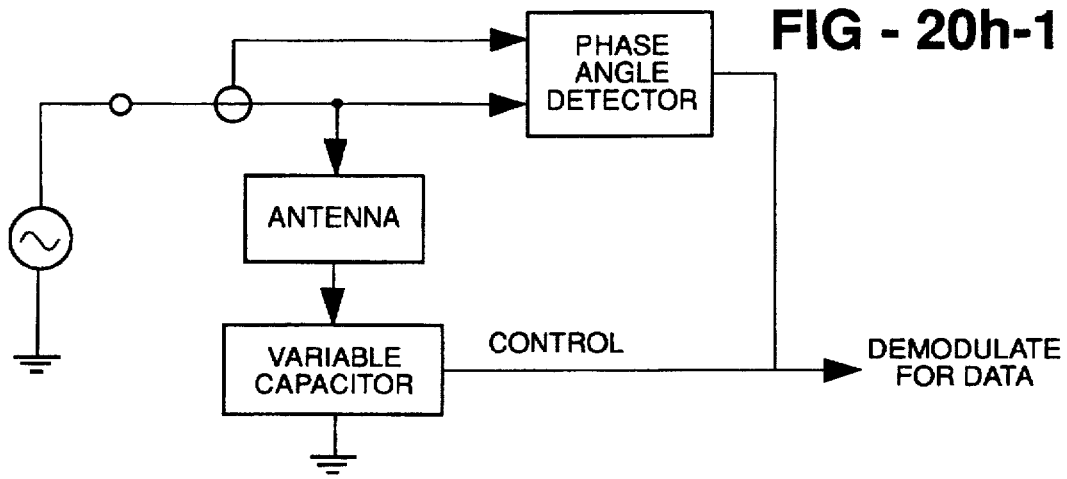
Figures 2, 20H:
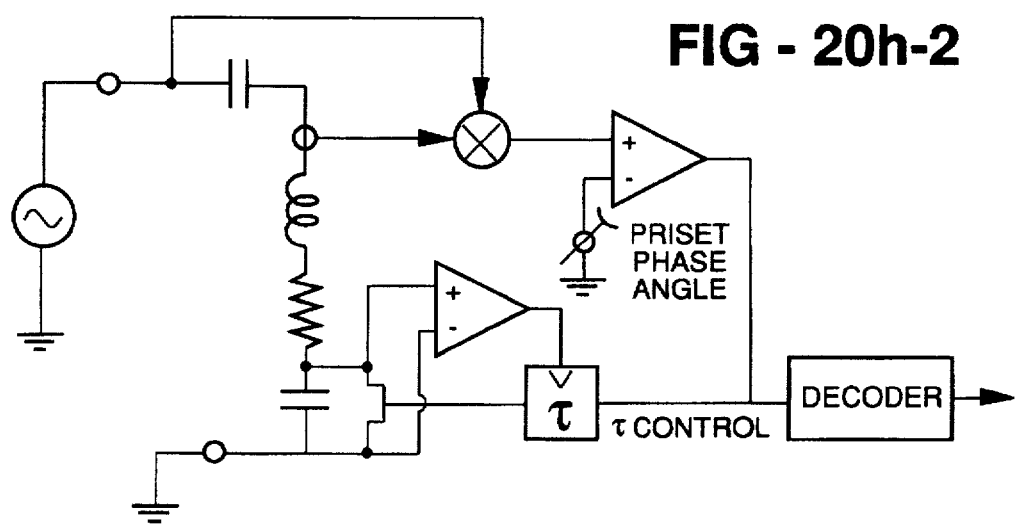
Figures 3, 20H:
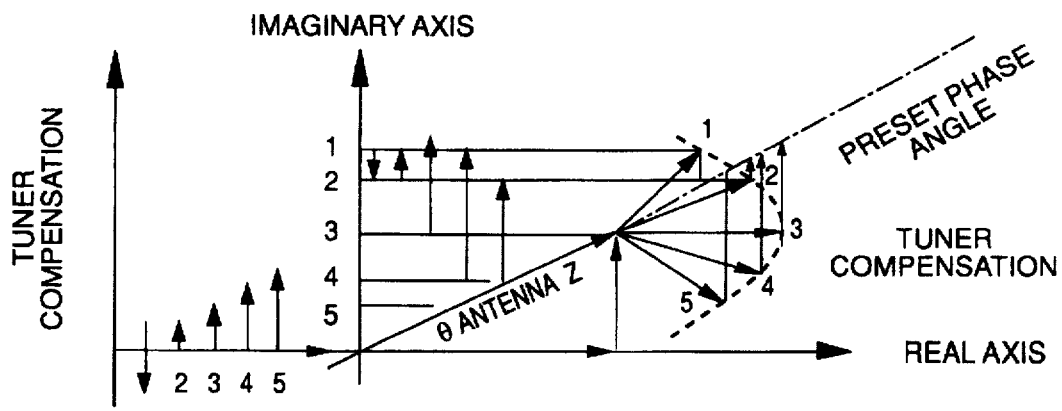

This variable capacitor is connected in series with the tuned antenna. Correct tuning is normally defined as the maintenance of a constant, pre-defined, phase angle between the current and voltage into the tuned element. In this case proper tuning relies upon the maintenance of a residual impedance angle (typically 32°) for the antenna. The transponder's coupled impedance adds to and alters the total antenna impedance. Under most conditions the impedance angle will be changed and the variable capacitor circuit will compensate for the transponder impedance re-establishing the proper residual phase angle. By monitoring the variable capacitor the transponders data can be decoded. FIG. 20H shows a block schematic, a circuit diagram and a phasor diagram of this type of system. An added advantage of this system is that it is always substantially perfectly tuned. Once again the information from the in-phase component can be augmented for decoding with the variable capacitor signal and/or with the quadrature component.

A full duplex data communication channel and power transmission system can be realised by combining the Magnetic Field Modulation System and the Coupled Impedance Signalling System.

Frequency or phase modulation of the magnetic field by the Magnetic Field Modulation System affects the currents and voltages in the field transmitting coil in a minor and predictable manner. Consequently signals transmitted by the Coupled Impedance Signalling System can be extracted and readily detected from the currents and voltages in the field transmitting coil.

At the receiver, phase changes in the pickup coil's current and voltage introduced by the Coupled Impedance Signalling System are easily compensated for in the circuitry designed to detect the frequency or phase modulation sent by the Magnetic Field Modulation System.

These two modulation systems can operate simultaneously providing a duplex channel using the same magnetic field while transmitting power to the receiving unit. Alternatively, the two data transmissions can be interleaved bit for bit so that only one data signal changes state at any time, thus making the separation of data signals a simple matter.

The present invention has many applications due to the need for actuation, identification, security, information and communication in many varied fields.

An exemplary application of the present invention is that of a rail switch point controller, as shown in block diagram form in FIG. 23. Especially in remote areas, switch point controllers need to be locally powered. Utilising the present invention, a powering field generator can be mounted on a train and an actuator and solenoid driver system for switch point control can be located at the switch point. As the train nears the switch point, the powering field generator can influence the actuator, which derives enough power from the field to drive the solenoid and control the rail switch point. The direction of movement of the switch point can be, for example, responsive to modulation of the powering field or frequency of the powering field.

Another exemplary application of the present invention as shown with reference to FIGS. 21 and 22 is that of a fully automated, rolling stock identification, tracking and control system. The system utilizes passive, machine-readable, reprogrammable transponders, together with remote interrogation and data transfer devices for those transponders. The system can remotely power and control, solenoid actuated transducers and provide a mobile, decentralised database for railway track and rolling stock management programs.

The system may provide an automatic, failsafe system for remotely discharging bulk commodity railroad vehicles, which is simple and convenient to use, reliable, using state-of-the-art technology.

The system maximizes railway rolling stock utilization and minimizes capital expenditure, reduces costly data communications associated with existing and future computer based railway management programs, and is far more effective than existing rolling stock identification and tracking systems and unparalleled in its versatility. The system is readily adapted to existing rolling stock and is complimentary to existing computer based railroad management programs and other electronic cost saving equipment.

The rolling stock system comprises

A. Transponder/Actuator (See FIGS. 21 to 30)

A transponder 41 is permanently attached, at a common location, to each item of rolling stock 42 intended for use within a particular management or operating plan. Each transponder incorporates a microprocessor and a 256 byte non-volatile memory microchip reprogrammable on the fly. All electronic components are permanently encapsulated in high impact-resistant plastic.

Up to 56 bytes of data storage can be protected and may be programmed, at installation, with the existing vehicle identification number (ID). The remaining bytes are available to be remotely programmed with other data as required.

Each transponder is fitted with external connectors permitting:

(1) Remote powering and control of up to four independent 24V DC solenoid actuators or like devices.

(2) Connection to sensors and switches for monitoring door position, air pressure and any other relevant wagon system.

The transponder does not contain a battery or need directly connected power to perform any of its functions. A radiated impinging powering field provides data, communication and power.

B. Interrogator(s)

An interrogator 40 generates the energy medium necessary for remotely powering, programming and reading each transponder 41. Two types of interrogators may be required:

(a) Fixed interrogators:

These are installed a short distance outside the minimum structural clearance diagram facing the vehicle transponders.

Installations at source dispatch depots will remotely transfer data to each vehicle transponder as the train is leaving the depot. This can be achieved at speeds up to 40 km/h.

Fixed interrogators will also be installed at the head of arrival sidings to retrieve data. At bulk handling facilities, fixed interrogators power and control all valving associated with the opening and closing of vehicle discharge doors.

(b) Hand-held portable interrogators:

These may be used to program each transponder with the vehicle ID at installation. In addition, portable interrogators will be used for any programming or reading function where vehicles are positioned outside the range of fixed interrogators, for example, when wagons are being shunted or are sitting in sidings.

C. Controller

The controller provides communicating and operating intelligence to all fixed interrogators. It can be positioned adjacent to, or at a remote location from the interrogator under its control. The controller can be a stand-alone unit for commodity dumping only situations, or connected to data logging equipment or to a central computer processing facility to provide data for railway management programs.

To appreciate the application potential of the system, the operation of an example installation for control of bulk commodities has been selected for description. This should be read in conjunction with FIG. 21.

(1) The first vehicle, with transponder attached and pre-programmed with the existing ID, is positioned ready for outloading at the source dispatch depot.

(2) Commodity loading takes place in accordance with established practices.

(3) Any variable data relating to the commodity is entered into the controller memory against the vehicle ID. For most bulk installations, the commodity type is constant and could constitute part of the protected memory of the controller as are depot code, date and time.

(4) Commodity quantity for each vehicle can be automatically recorded in the controller if static or coupled in-motion train weighing equipment is available.

(5) Stages (1), (2), (3) and (4) are repeated until all vehicles in the consist are loaded.

(6) When the train departs from the source dispatch depot, a fixed interrogator positioned at the end of the loadout loop is activated and in turn energizes each vehicle transponder 41 which then transmits its ID back to the interrogator 40. Stored data related to each vehicle ID is then automatically retrieved and transferred from the controller to the transponder memory and retained.

(7) All data relating to each individual vehicle in the train has now been downloaded from the source dispatch depot and is being transported by the respective individual vehicle in the consist.

(8) Upon arrival at the bulk handling facility, the train assumes dumping speed. A fixed interrogator positioned at the head of the loadout pit is activated and energizes the transponder attached to the first vehicle. The vehicle ID is transmitted back to the interrogator and checked for acceptance, via the controller with existing or introduced administration computer equipment. Verification will initiate a command instruction to remotely power, in sequence, the appropriate transducers to activate the discharge door opening cycle.

(9) Following the command to dump, stored data downloaded at the source dispatch depot is automatically retrieved and transferred from the transponder to the administration computer.

(10) A second fixed interrogator positioned at the end of the loadout pit is activated and commands the transponder to initiate the discharge door closing cycle. Confirmation that the doors are closed and locked is sensed by mechanically activated switches. Proper closure is recorded by the administration computer along with facility code, date and time.

(11) Stages (8), (9) and (10) are repeated until all vehicles in the consist have been unloaded.

(12) All data related to the train movement from commencement of loading to completion of unloading, can now be relayed from the administration computer to a central processing facility for management control purposes.

For this particular installation, the cumulative data collected via the system can be used for:

(a) Rolling Stock Control and Management.
(b) Commodity Control and Management.
(c) Direct Customer Debiting.
(d) Maintenance Scheduling.
(e) General Statistical Analysis.

However, if all rolling stock, including locomotives, are fitted with transponders, and interrogators are installed at all freight terminals and at major crossing loops and junctions, the application potential and cost saving benefits offered by the system are further increased. The system is passive and uses an energy medium that is biologically safe and interference free.

The remote transmission of significant electrical energy over meaningful distances is extremely rare in the commercial world. The present invention provides a means of overcoming this problem.

Conventionally remote powering is achieved using electromagnetic means where an electromagnetic field is transmitted from the powering unit to a powered unit. Two principal factors prevent the remote transmission of sizable amounts of power by an electromagnetic field.

1. Rapid decrease of field strength with distance.
2. Restrictive radiation limits imposed by telecommunications regulations.

The rapid decrease of field strength with distance is a physical phenomena countered only by increasing the field strength at its source. This increases the radiation of electromagnetic energy. Eventually the maximum radiation limits imposed by telecommunications regulations are reached and no further increase in field strength is possible. The present invention provides a method of increasing the field strength used for powering without substantially increasing the radiated field.

The system utilized the different physical properties of the "near" and "far" electromagnetic fields. The "near" field is used for powering and diminishes rapidly with distance. The "far" field is the radiation field, which diminishes slowly with distance and must be held below statutory limits beyond a prescribed distance from the field source. Normally a single antenna is used to generate the near field for powering and the radiation far field is controlled by limiting the antenna's output.

In this invention special antennas are used that generate strong near fields but for which the far fields automatically cancel out. The basic principal is to use at least two antennas or a two part antenna each part of which generates an opposing "far" field. At any distant point the far field from one antenna (or part) will nearly cancel the field from the other antenna (or part). However, the near field around each antenna is not substantially affected by the presence of the other antenna's near field. The powered unit is placed so that it is only substantially affected by the near field of one antenna (or antenna part). Strong antenna fields can be used now with substantial cancellation of the radiation far field. FIG. 24 diagrammatically represents this configuration and shows the near field's strengths due to two antennas. Alternatively an antenna(s) can be configured such that the powering near fields add together yet the radiation far fields subtract from each other. FIG. 25 diagrammatically represents the configuration and shows the near field strengths.

Many antenna configurations are possible for which the far fields substantially cancel yet there is a strong useful near field still present. FIG. 26 shows some such configurations.

In all the Figures the actual shape of the antenna is not implied. The antennas could be circular, rectangular, square, elliptical, tubular or any other practical shape.

The use of paired antennas for far field cancellation is particularly convenient for railway applications.

The relative position of transponders are transposed diagonally across the centre line of the wagon if the wagon is turned around. Wagons normally do not have a preferred direction of travel and can be coupled with either end closest to the locomotive. Two interrogator antennas spaced diagonally across the track centre line are necessary to interrogate transponders at precisely the same wagon location regardless of wagon direction. These antennas can be conveniently driven antiphased to cancel their far field. FIGS. 27 to 30 show in plan and cross-section view the antenna arrangement for side and bottom mounted transponders.

I claim:

1. A passive actuator device for supplying power to an external device in response to an impinging magnetic powering field, comprising:

an inductive coil adapted to receive a magnetic powering field transmitted from an interrogator, said coil providing an induced powering signal when in the presence of the magnetic field, a first portion of said powering signal supplying power to said actuator device, a plurality of output terminals for connection to the external device, and a circuit operable upon being energized by the first portion of the powering signal to provide selectively a further portion of said powering signal as supply power to at least one of said output terminals to thereby supply power to the external device.

2. An actuator device as claimed in claim 1, wherein said inductive coil is adapted to receive data via a modulated magnetic field and wherein the actuator device further comprises:

a circuit coupled to said inductive coil and adapted to extract the data received by said inductive coil, wherein said data includes command and/or informational signals.

3. An actuator device as claimed in claim 2, wherein said circuit includes a switch coupled to said inductive coil; and wherein said circuit is operable to determine if the data constitutes a valid command and, upon receipt of the valid command, activate said switch to provide the further portion of the powering signal to the external device.

4. An actuator device as claimed in claim 2, wherein said inductive coil and said circuit are adapted to obtain the powering signal and the data from a single modulated magnetic field.

5. An actuator device as claimed in claim 2, wherein said switch comprises a transistor.

6. An actuator device as claimed in claim 1, wherein the additional supply power is sourced from a tap on said coil.

7. An actuator device as claimed in claim 1, further comprising:

driver means for providing information, status and/or code signals to said coil for transmission to said interrogator.

8. An actuator device as claimed in claim 7, further comprising rectifer means coupled between one end of said coil and a reference potential, said driver means being coupled to said coil between said one end of said coil and its other end wherein said coil is adapted to transmit said information, status and/or code signals.

9. An actuator device as claimed in claim 1, including means for dissipating any unused powering signal.

10. An actuator device as claimed in claim 1, further comprising modulator means adapted to modulate said powering signal with data, status and/or information signals for transmission via said coil to said interrogator.

11. An actuator device as claimed in claim 10, wherein said modulator means utilizes coupled impedance signalling.

12. An actuator device as claimed in claim 10, wherein said modulator means utilizes shunting of a capacitor coupled to said coil, said shunting being synchronous with said powering signal.

13. A passive actuator device adapted to be influenced by a magnetic field that is transmitted from an interrogator and that is modulated in accordance with a data communication, said device comprising:

receiver means including an inductive coil adapted to receive the magnetic field and provide an induced powering signal when in the presence of the magnetic field, a first portion of said powering signal providing a source of power to said actuator device, logic means coupled to said receiver means and adapted to demodulate the powering signal to thereby extract the data communication, said logic means being further adapted to provide a control signal in accordance with the data communication, and switch means responsive to said control signal and being adapted to direct a further portion of said powering signal to an external electric or electromechanical device.

14. An actuator as claimed in claim 13, wherein the actuator is mounted on a rolling stock railway wagon and the external device is a solenoid.

15. An actuator as claimed in claim 14, further comprising sensing means adapted to provide information regarding door operation to said actuator.

16. An actuator as claimed in claim 13 wherein in response to said control signal, said logic means provides a command signal to provide a controlling function on said external device.

17. An actuator device as claimed in claim 13 or 16, further comprising:
 transmitter means coupled to said logic means, said transmitter means being adapted to transmit second data to the interrogator.

18. An actuator device as claimed in claim 17, wherein said second data includes information received from the external device.

19. An actuator as claimed in claim 13, wherein said inductive coil is a single inductive coil.

20. An actuator as claimed in claim 19, wherein the actuator is mounted on a rolling stock railway wagon and the external device is a solenoid operated pneumatic valve operable to open doors on said wagon.

21. An actuator as claimed in claim 20, further comprising sensing means adapted to provide information regarding door operation to said actuator.

22. An actuator as claimed in claim 19, wherein the further portion of said powering signal is sourced from a tap on said inductive coil.

23. An actuator as claimed in claim 19, further including means for dissipating any unused powering signal.

24. An actuator as claimed in claim 19, wherein the powering signal has a frequency and wherein said inductive coil is tuned by shunting of a capacitor, the shunting being synchronous with the frequency of said powering signal.

25. An actuator as claimed in claim 19, wherein in response to said control signal, said logic means provides a command signal to provide a controlling function on said external device.

26. An actuator as claimed in claim 25, wherein said data includes command and/or informational signals.

27. An actuator as claimed in claim 19 or 25, further comprising transmitter means coupled to said logic means, said transmitter means being adapted to transmit data signals to the interrogator.

28. An actuator as claimed in claim 19 or 25, further comprising modulator means adapted to modulate said powering signal with data, status and/or information signals for transmission by said inductive coil to the interrogator.

29. An actuator as claimed in claim 28, wherein said modulator means utilizes coupled impedance signalling.

30. An actuator as claimed in claim 28, wherein said modulator means utilizes shunting of a capacitor coupled to said coil, said shunting being synchronous with said powering signal.

31. An actuator as claimed in claim 27 or 28, wherein said data signals include information received from the external device.

32. A system for remote actuation of an external device, comprising:
 a passive actuator device and an inductive powering device adapted to remotely power said actuator device, said powering device generating a first near field, a first far field, a second near field and a second far field,
 said passive actuator device comprising:
  an inductive coil adapted to extract power from said near fields when in relatively close proximity to said powering device and to thereby provide a powering signal, wherein said actuator device is configured such that a first portion of the powering signal supplies electrical power used by said actuator device, and
  a circuit operable upon being energized by the first portion of the powering signal to provide selectively a further portion of the powering signal as supply power to the external device, and
 said powering device comprising:
  a field generating means having a first portion and a second portion, the first portion being adapted to generate the first fields, the second portion being adapted to generate the second fields, wherein:
   the first portion generates the first far field substantially antiphase with respect to the second far field generated from the second portion such that the first far field and the second far field substantially cancel each other at a predetermined distance from the generating means.

33. A system as claimed in claim 32, wherein each of the first and second near fields are substantially undiminished by the presence of the other of the first and second near fields.

34. A system as claimed in claim 33, wherein the first and second portions each comprise a coil.

35. A system as claimed in claim 34, wherein said first and second portions are located along opposite sides of a railway line and are spaced along the railway line by a distance approximately equal to the length of a railway wagon.

36. A system as claimed in claim 32, wherein the first and second portions each comprise a coil.

37. A system as claimed in claim 36, wherein said first and second portions are located along opposite sides of a railway line and are spaced along the railway line by a distance approximately equal to the length of a railway wagon.

38. A system as claimed in claim 32, wherein the actuator is mounted on a rolling stock railway wagon and the external device is a solenoid, further wherein
 the powering device is located at a wagon unloading terminus.

39. A system as claimed in claim 32, wherein said inductive coil is a single inductive coil.

* * * * *